US006541168B2

(12) United States Patent
Brown et al.

(10) Patent No.: US 6,541,168 B2
(45) Date of Patent: *Apr. 1, 2003

(54) VACUUM ULTRAVIOLET TRANSMITTING DIRECT DEPOSIT VITRIFIED SILICON OXYFLUORIDE LITHOGRAPHY GLASS PHOTOMASK BLANKS

(75) Inventors: John T. Brown, Corning, NY (US); Stephen C. Currie, Corning, NY (US); Lisa A. Moore, Corning, NY (US); Susan L. Schiefelbein, Corning, NY (US); Robert S. Pavlik, Jr., Corning, NY (US)

(73) Assignee: Corning Incorporated, Corning, NY (US)

( * ) Notice: Subject to any disclaimer, the term of this patent is extended or adjusted under 35 U.S.C. 154(b) by 91 days.

This patent is subject to a terminal disclaimer.

(21) Appl. No.: 09/841,517

(22) Filed: Apr. 24, 2001

(65) Prior Publication Data

US 2002/0018942 A1 Feb. 14, 2002

Related U.S. Application Data

(60) Provisional application No. 60/200,405, filed on Apr. 28, 2000, provisional application No. 60/258,132, filed on Dec. 22, 2000, provisional application No. 60/271,136, filed on Feb. 24, 2001, and provisional application No. 60/271,136, filed on Feb. 24, 2001.

(51) Int. Cl.[7] .............................. G03F 9/00; C03C 15/00
(52) U.S. Cl. ............................................ 430/5; 65/30.1
(58) Field of Search ......................... 430/5; 501/57; 428/426, 428, 433; 65/17.4, 17.5, 17.6, 397, 424, 427, 30.1

(56) References Cited

U.S. PATENT DOCUMENTS

| 5,326,729 A | 7/1994 | Yaba et al. ............... 501/54 |
| 5,474,589 A | 12/1995 | Ohga et al. .............. 65/397 |
| 5,616,159 A | 4/1997 | Araujo et al. ............ 65/17.4 |
| 5,668,067 A | 9/1997 | Araujo et al. ............ 501/54 |
| 5,735,921 A | 4/1998 | Araujo et al. ............ 65/32.1 |
| 6,087,283 A | 7/2000 | Jinbo et al. .............. 501/54 |
| 6,109,065 A | 8/2000 | Atkins et al ............. 65/399 |
| 6,259,554 B1 | 7/2001 | Shigematsu et al. ...... 359/337 |

FOREIGN PATENT DOCUMENTS

| EP | 0636586 A1 | 2/1995 | ............ C03C/3/06 |
| EP | 0901989 A1 | 3/1999 | ........... C03B/19/14 |
| JP | 1-201664 | 8/1989 | ............ G03F/1/00 |
| JP | P2001-19450 A | 1/2001 | ........... C03B/20/00 |

OTHER PUBLICATIONS

Millipore, "Waferpure Micro/Mini–XL/Megaline Gas Purifiers", pp. 1–8.
J. Opt. Soc. AM. B, "Densification Of Fused Silica Under 193–nm Excitation", Jul. 1997, pp. 1–10.
Optical Letters, "193–nm Excimer–Laser–Induced Densification Of Fused Silica", Dec. 15, 1996, pp. 1–3.

Primary Examiner—S. Rosasco
(74) Attorney, Agent, or Firm—Edward F. Murphy

(57) ABSTRACT

High purity direct deposit vitrified silicon oxyfluoride glass suitable for use as a photomask substrates for photolithography applications in the VUV wavelength region below 190 nm is disclosed. The inventive direct deposit vitrified silicon oxyfluoride glass is transmissive at wavelengths around 157 nm, making it particularly useful as a photomask substrate at the 157 nm wavelength region. The inventive photomask substrate is a dry direct deposit vitrified silicon oxyfluoride glass which exhibits very high transmittance in the vacuum ultraviolet (VUV) wavelength region while maintaining the excellent thermal and physical properties generally associated with high purity fused silica. In addition to containing fluorine and having little or no OH content, the inventive direct deposit vitrified silicon oxyfluoride glass suitable for use as a photomask substrate at 157 nm is also characterized by having less than $1 \times 10^{17}$ molecules/cm$^3$ of molecular hydrogen and low chlorine levels.

19 Claims, 16 Drawing Sheets

Figure 1:
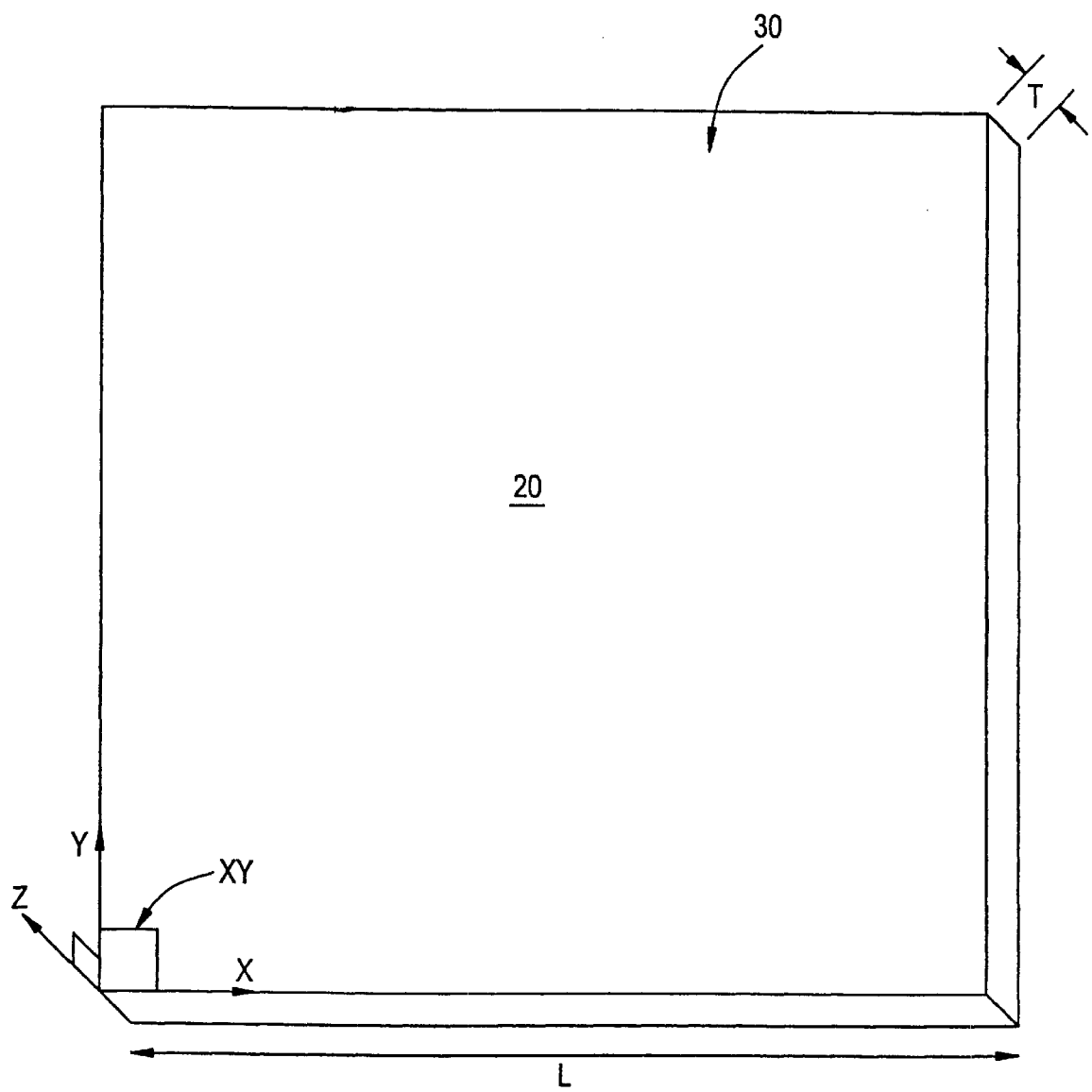

Measured transmission of Corning's HPFS compared to glass produced using the direct-laydown, dry combustion process.

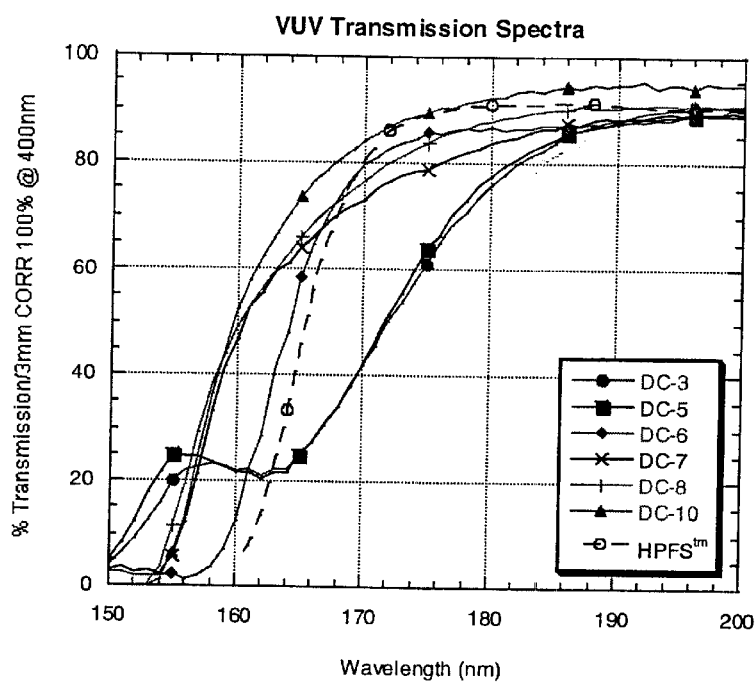
FIG. 15: Measured transmission of Corning's HPFS compared to glass produced using the direct-laydown, dry combustion process.

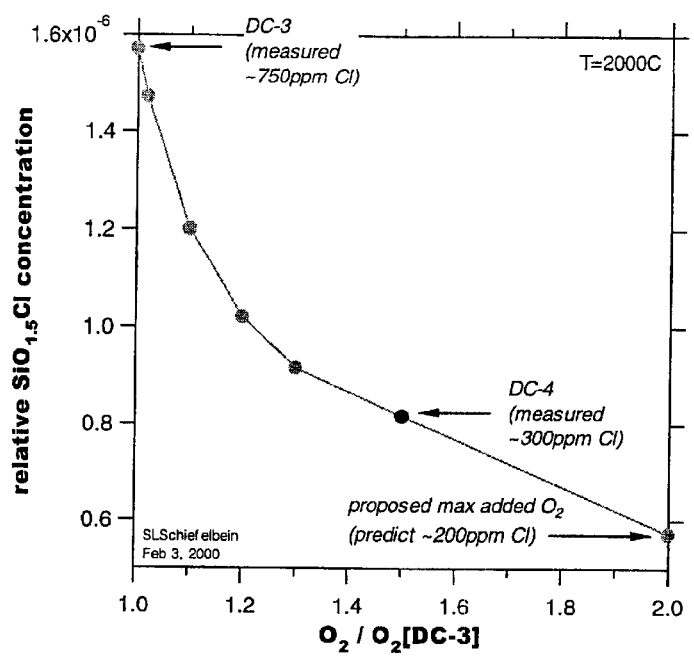
FIG. 16: Predicted chlorine content of the glass (DC3 is used as the baseline condition) as a function of $O_2$ content of the combustion atmosphere.

US 6,541,168 B2

VACUUM ULTRAVIOLET TRANSMITTING DIRECT DEPOSIT VITRIFIED SILICON OXYFLUORIDE LITHOGRAPHY GLASS PHOTOMASK BLANKS

CROSS-REFERENCE TO RELATED APPLICATIONS

This application claims priority to, and the benefit of, U.S. Provisional Patent Application No. 60/200,405 filed Apr. 8, 2000 entitled "Water-Free Fused Silica And Method Therefor," and U.S. Provisional Patent Application No. 60/258,132 filed Dec. 22, 2000 entitled "Substantially Dry, Silica-Containing Soot, Fused Silica And Optical Fiber Soot Preforms, Apparatus, Methods And Burners For Manufacturing Same And Method Therefor," and U.S. Provisional Patent Application No. 60/271,136 filed Feb. 24, 2001, entitled Vacuum Ultraviolet Transmitting Silicon Oxyfluoride Lithography Glass, and U.S. Provisional Patent Application No. 60/271,135, filed Feb. 24, 2001, entitled Oxygen Doping of Silicon Oxyfluoride Glass, and PCT Application WO 01/17919, Sep. 8, 2000, entitled Pure Fused Silica, Furnace And Method, the disclosures of which are hereby incorporated by reference herein.

FIELD OF THE INVENTION

The present invention relates generally to lithography, and particularly to optical photolithography glass for use in optical photolithography systems utilizing vacuum ultraviolet light (VUV) wavelengths below 193 nm, preferably below 175 nm, preferably below 164 nm, such as VUV projection lithography systems utilizing wavelengths in the 157 nm region.

The invention relates to VUV transmitting glass that is transmissive at wavelengths below 193 nm, in particular, a photomask silicon oxyfluoride glass suitable for use in the Vacuum Ultraviolet (VUV) 157 nm wavelength region.

BACKGROUND OF THE INVENTION

Refractive optics requires materials having high transmittance. For semi-conductor applications where smaller and smaller features are desired at the 248 and 193 nm wavelengths, high purity fused silica has been show to exhibit the required minimum transmittance of 99%/cm or better.

Projection optical photolithography systems that utilize the vacuum ultraviolet wavelengths of light below 193 nm provide benefits in terms of achieving smaller feature dimensions. Such systems that utilize vacuum ultraviolet wavelengths in the 157 nm wavelength region have the potential of improving integrated circuits with smaller feature sizes. Current optical lithography systems used by the semiconductor industry in the manufacture of integrated circuits have progressed towards shorter wavelengths of light, such as the popular 248 nm and 193 nm wavelengths, but the commercial use and adoption of vacuum ultraviolet wavelengths below 193 nm, such as 157 nm has been hindered by the transmission nature of such vacuum ultraviolet wavelengths in the 157 nm region through optical materials. Such slow progression by the semiconductor industry of the use of VUV light below 175 nm such as 157 nm light has been also due to the lack of economically manufacturable photomask blanks from optically transmissive materials. For the benefit of vacuum ultraviolet photolithography in the 157 nm region such as the emission spectrum VUV window of a $F_2$ excimer laser to be utilized in the manufacturing of integrated circuits there is a need for mask blanks that have beneficial optical properties including good transmission below 164 nm and at 157 nm and that can be manufactured economically.

The present invention overcomes problems in the prior art and provides a economical high quality improved photomask blanks and VUV transmitting lithography glass that can be used to improve the manufacturing of integrated circuits with vacuum ultraviolet wavelengths.

Use of high purity fused silica as optical elements in photolithography stems from the fact that high purity fused silica is transparent over a wide range of wavelengths, spanning from the infrared to deep ultraviolet regions. Furthermore, high purity fused silica exhibits excellent chemical durability and dimensional stability. It has been suggested in EP 0 636 586 A1 that in order to be suitable for use as a photomask substrate for certain photolithography applications at 248 and 193 nm wavelengths, high purity fused silica made by the direct flame method must contain high molecular hydrogen in the range of $10^{17}$ to $10^{19}$ molecules/cm$^3$. Similarly, JP 1-201664 discloses that synthetic quartz glass for use as photomask material whose optical properties have been changed due to sputtering, plasma etching or excimer irradiation, can be restored to its original condition by heat treating the glass in a hydrogen atmosphere. Specifically, this document describes the effect on synthetic quartz of exposure to 248 and 193 nm wavelengths. The effect of exposure to 248 and 193 nm wavelengths on fused silica is also described in "Densification of Fused Silica under 193 nm excitation," by Borrelli et al, in J. Opt. Soc. Am. B/Vol. 14, No. 7, pp. 1606–1615 (July 1997); and by Allan et al., in "193-mn excimer-laser-induced densification of fused silica," Optics Letters, Vol. 21, No. 24, pp. 1960–1962 (Dec. 5, 1996).

EP 0 901 989 A1 discloses a manufacturing method for making silica glass substantially free of chlorine. In a direct deposit concurrent vitrifying process silicon tetrafluoride is flame hydrolyzed to provide a silica glass in which fluorine is controlled within the range 100 ppm to 450 ppm and OH group density in the range from 600 ppm to 1300 ppm.

U.S. Pat. No. 5,326,729 discloses quartz glass having excimer laser resistance produced by subjecting the glass to dehydration treatment in a temperature range lower than the transparent vitrification temperature of the glass followed by transparent vitrification and molding to a desired shape, followed by a doping treatment in a hydrogen atmosphere.

U.S. Pat. No. 5,474,589 discloses a UV light permeable fluorine-doped synthetic quartz glass with decreased defects.

Applicants, previously have disclosed several effective methods for improving the optical properties of high purity fused silica when used as an optical lens in photolithography at both the 248 and 193 run wavelength regions. See for example, U.S. Pat. Nos. 5,616,159; 5,668,067 and 5,735,921 all incorporated herein by reference.

Accordingly, it is an object of the present invention to disclose VUV transmitting dry direct deposit vitrified silicon oxyfluoride glasses for use at VUV wavelengths below 193 nm, preferably in the $F_2$ Excimer Laser 157 nm region, methods of making such glass, and methods of making dry direct deposit vitrified lithography glass articles.

SUMMARY OF THE INVENTION

In the present invention we disclose VUV transmitting dry direct deposit vitrified silicon oxyfluoride lithography glass suitable for use as optical elements, for use as a lens or preferably for use as a photomask substrate at VUV wavelengths below 193 nm. In particular, the inventive direct deposit vitrified silicon oxyfluoride glass production exhibits benifits tailored for optical lithography articles and applications in the photolithography VUV wavelength region around the 157 nm Excimer laser wavelengths and below 193 nm.

The object of the invention is achieved by use of a dry low hydroxy radical fluorine-doped $SiO_2$ fused direct deposit vitrified synthetic silicon oxyfluoride glass which exhibits high transmittance in the vacuum ultraviolet (VUV) wavelength region while exhibiting excellent thermal and physical properties. By "dry" we mean having an OH content below 50 ppm by weight, preferably dehydrated below 10 ppm OH by weight, and most preferably below 1 ppm by weight.

In another aspect, the object of the invention is further achieved by ensuring that the dry direct deposit vitrified silicon oxyfluoride glass is essentially free of chlorine.

In yet another aspect, the object of the invention is achieved by ensuring a low molecular hydrogen content in the dry direct deposit vitrified glass. By this we mean that the molecular hydrogen ($H_2$) content is below $1 \times 10^{17}$ molecules/cm$^3$. In a preferred embodiment of the invention, the VUV transmitting dry direct deposit vitrified silicon oxyfluoride glass has a fluorine content in the range of 0.1 to 0.4 weight percent which inhibits laser exposure induced absorption and provides laser exposure durability with minimal transmission loss at 157.6 nm after prolonged exposure. The invention includes a below 193 nm VUV transmitting glass photomask substrate for photolithography at wavelengths of about 157 nm with the glass being a high purity dry direct deposit vitrified silicon oxyfluoride glass with an OH content below 50 ppm by weight, hydrogen content below $1 \times 10^{17}$ molecules/cm$^3$ and a fluorine content in the 0.1 to 0.4 weight percent range.

The invention includes a process of making VUV transmitting glass silicon oxyfluoride glass that includes providing a hydrogen-free fuel carbon monoxide combustion burner; providing a heat containing direct deposit furnace; providing a supply of carbon monoxide and a supply of oxygen to said carbon monoxide combustion burner to form a carbon monoxide combustion reaction flame, providing a direct glass deposition surface proximate said flame, supplying a Si-glass precursor feedstock and a F-glass precursor feedstock to said carbon monoxide combustion burner wherein said Si-glass precursor feedstock and said F-glass precursor feedstock is reacted in said flame into a silicon oxyfluoride glass soot directed at said glass deposition surface, and said soot is concurrently directly deposited and vitrified into a dry direct deposit vitrified silicon oxyfluoride glass body.

The invention includes a dry direct deposit vitrified silicon oxyfluoride glass having essentially no OH groups, less than $5 \times 10^{16}$ molecules/cm$^3$ of molecular hydrogen, and a fluorine content in the range of 0.1 to 0.4 weight %. The invention includes a dry direct deposit vitrified silicon oxyfluoride lithography glass having an OH content less than 5 ppm by weight, a Cl content less than 5 ppm by weight, a H2 content less than $1 \times 10^{17}$ molecules/cm$^3$, and a fluorine content of 0.1 to 0.4 weight % with a 157 nm internal transmission of at least 85%/cm. The invention includes a VUV pattern printing method with the steps of providing a below 164 nm radiation source for producing VUV photons, providing a dry direct deposit vitrified silicon oxyfluoride glass having less than 5 ppm by weight OH, less than 5 ppm by weight Cl, a<0.5 weight percent fluorine content, and 157 nm and 165 nm measured transmission of at least 75%/5 mm. The pattern printing method includes transmitting the VUV photons through the dry direct deposit vitrified silicon oxyfluoride glass, forming a pattern with the VUV photons and projecting the pattern onto a VUV radiation sensitive printing pattern. The invention includes a dry direct deposit vitrified VUV transmitting silicon oxyfluoride glass having a OH content less than 5 ppm by weight, a fluorine content of at least 0.1 weight %, the glass consisting essentially of Si, O, and F with an internal transmission in the wavelength range of 157 nm to 175 nm of at least 85%/cm and a 165 nm absorption less than 0.4 (absorption units/5 mm) after exposure to a 157 nm laser for 41.5 million pulses at 2 mJ/cm$^2$-pulse.

The invention includes a below 193 nm VUV transmitting glass photomask substrate for photolithography at wavelengths of about 157 nm, said glass photomask substrate comprising a dry high purity direct deposit vitrified silicon oxyfluoride glass with an OH content below 20 ppm by weight, a Cl content below 0.1% by weight, and a fluorine content in the range of 0.01 to 7 weight percent.

The invention includes a method of making a below 193 nm VUV transmitting optical lithography glass for transmitting wavelengths of about 157 nm, said method comprising providing a hydrogen-free fuel carbon monoxide combustion burner; providing a supply of carbon monoxide and a supply of oxygen to said carbon monoxide combustion burner to form a carbon monoxide combustion reaction flame, providing a direct glass deposition surface proximate said flame, supplying a Si-glass precursor feedstock and a said F-glass precursor feedstock to said carbon monoxide combustion burner wherein said Si-glass precursor feedstock and said F-glass precursor feedstock is reacted in said flame into a silicon oxyfluoride glass soot directed at said glass deposition surface, and said soot is concurrently directly deposited and vitrified into a silicon oxyfluoride glass body.

The invention includes a method of making a homogeneous glass optical lithography element, said method comprising providing a hydrogen-free fuel carbon monoxide combustion burner; providing a supply of carbon monoxide and a supply of oxygen to said carbon monoxide combustion burner to form a carbon monoxide combustion reaction flame, providing a direct glass deposition surface proximate said flame, supplying a Si-glass precursor feedstock and a dopant R-glass precursor feedstock to said carbon monoxide combustion burner wherein said Si-glass precursor feedstock and said dopant R-glass precursor feedstock is reacted in said flame into a dry R doped silica glass soot directed at said glass deposition surface, and said soot is concurrently directly deposited and vitrified into a dry homogeneous R doped silica glass body, and forming said directly deposited vitrified glass body into a homogeneous glass optical lithography element. In preferred embodiments of the method of making dry R doped silica glass, the glass dopant R is chosen from the glass dopant group consisting of F, Ti, Ge, B, P, and Al.

The invention includes a method of making a homogeneous glass optical lithography element, said method comprising providing a hydrogen-free fuel carbon monoxide combustion burner; providing a supply of carbon monoxide and a supply of oxygen to said carbon monoxide combustion burner to form a carbon monoxide combustion reaction flame, providing a direct glass deposition surface proximate said flame, supplying a Si-glass precursor feedstock to said carbon monoxide combustion burner wherein said Si-glass precursor feedstock is reacted in said flame into a dry high purity silica glass soot directed at said glass deposition surface, and said soot is concurrently directly deposited and vitrified into a dry homogeneous high purity silica glass body, and forming said directly deposited vitrified glass body into a homogeneous glass optical lithography element.

The method of making below 193 nm VUV transmitting silicon oxyfluoride glass includes providing a hydrogen-free fuel combustion burner, with the preferred hydrogen-free fuel combustion burner being a carbon monoxide combustion burner. The method includes providing a supply of hydrogen-free carbon monoxide fuel and a supply of oxygen to the combustion burner to form a carbon monoxide combustion reaction flame which is contained within a heat containing direct deposit furnace. A direct glass deposition surface is provided in said furnace proximate and preferably below said carbon monoxide burner and flame. Alternative hydrogen-free fuel combustion fuels include carbon suboxide and carbonyl sulfide. a supply of carbon monoxide and oxygen to the combustion burner maintains the carbon monoxide flame to which is supplied a Si-glass precursor feedstock and a F-glass precursor feedstock. Preferably the Si-glass precursor feedstock is hydrogen free, such as silicon tetrachloride and silicon tetraisocyanate [$Si(NCO)_4$].

The process and apparatus in accordance with one embodiment of the invention manufactures substantially water-free silica glass. The process and apparatus to make such water-free fused silica glass does so by eliminating the possibility of water ever forming in the combustion atmosphere. This is achieved in a first embodiment thereof by utilizing a substantially hydrogen-free fuel, such as carbon monoxide (CO), carbon suboxide ($C_3O_2$), carbonyl sulfide (COS), and the like. Use of such substantially H-free fuels minimizes water formation in the combustion reaction. According to a preferred embodiment, it is desired to use a substantially hydrogen-free raw material as a glass precursor for silica also. Most preferably, a combination of substantially hydrogen-free raw material and substantially hydrogen-free fuel is utilized. Typical examples of substantially H-free glass precursors include silicon carbide (SiC), silicon monoxide (SiO), silicon nitride ($Si_3N_4$), silicon tetrabromide ($SiBr_4$), silicon tetrachloride ($SiCl_4$), silicon tetraiodide ($SiI_4$) and silica ($SiO_2$). $Si(NCO)_4$ may also be utilized.

In accordance with the invention, when carbon monoxide, for example, is used as the fuel and combined with oxygen, the only by-product is carbon dioxide. This by-product is easily disposed of and, advantageously, no water is formed from the process reaction. This reaction is illustrated by the following equation.

$$CO + \tfrac{1}{2}O_2 \rightarrow CO_2$$

It was recognized that the available heat from carbon monoxide is about one-fourth the heat available from natural gas (methane). Therefore, four times the fuel would be required to produce the same amount of heat. However, only one-half mole of combustion supporting oxygen is required to combust one mole of CO. Thus, the total volume of oxygen required is the same for either fuel to produce the same amount of heat. The following equation shows the required carbon monoxide fuel needed to match the available heat of combusting one mole of methane ($CH_4$) used in one prior art process.

$$4CO + 2O_2 \rightarrow 4CO_2$$

The equation below shows the by-products and combustion supporting oxygen needed for combustion of one mole of methane in the prior art.

$$CH_4 + 2O_2 \rightarrow 2H_2O + CO_2$$

Thus, from the foregoing, it should be recognized that the production of substantially water-free silica glass is obtainable.

A method for producing a vitrified glass article is provided by the invention. The inventive method comprising several steps. First, heat is generated from a combustion burner having a flame produced by igniting a substantially hydrogen-free fuel. According to the invention, the flame is the only source of heat. Next, a glass precursor is flowed into the flame to produce silica-containing soot. Finally, the silica-containing soot is deposited onto a substrate and substantially simultaneously converted (by the heat of the flame) to form the vitrified glass article by the heat of the flame. In a preferred embodiment, soot is deposited onto a silica-containing glass member, such as a fused silica puck. According to this method, the vitrified glass article contains very low amounts of water. The step of depositing preferably takes place within a furnace chamber that may include a purge gas, such as nitrogen provided thereto. This method is adapted for producing homogeneous glass. According to the invention, a hydrogen-free fuel carbon monoxide combustion burner is utilized. The burner comprises a fume passage adapted to supply, at a first flow rate, a glass precursor, and a fuel passage surrounding the fume passage, the fuel passage adapted to supply a substantially hydrogen-free fuel at a flow rate at least 20 times the first flow rate. The burner may also include an inner shield passage between the fuel passage and the fume passage adapted to supply at least oxygen. The burner may further comprise an outer shield passage surrounding the fuel passage for introduction of additional gasses.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description are exemplary of the invention, and are intended to provide an overview or framework for understanding the nature and character of the invention as it is claimed. The accompanying drawings are included to provide a further understanding of the invention, and are incorporated in and constitute a part of this specification. The drawings illustrate various embodiments of the invention, and together with the description serve to explain the principals and operation of the invention.

DETAILED DESCRIPTION OF THE INVENTION

Reference will now be made in detail to the present preferred embodiments of the invention, examples of which are illustrated in the accompanying drawings.

We have shown that high transmission at below 190 nm, in particular below 175 nm, and most preferably at the $F_2$ Excimer Laser wavelength output centered around 157 nm can be provided in $SiO_2$ containing silicon oxyfluoride glasses by minimizing the OH or water content of the glass. Specifically, we have demonstrated that low OH low chlorine silicon oxyfluoride glass exhibits high transmissivity.

The transmission properties of glass in general are dependent on glass composition. In pure silica, it has been demonstrated that even trace levels (ppm or less) of metal contaminants can cause significant reductions in transmission in the ultraviolet region. We have demonstrated that besides metal impurities, the most important variables for controlling the VUV transmission edge of silicon oxyfluoride glass include its water or OH content, as well as its chlorine content. Specifically, we have found that the lower the OH content, the better the transmission, while the higher the chlorine content, the lower the transmission in the VUV 157 nm region. In addition, we have found that the amount of molecular hydrogen in the glass has to be minimized. Most preferably the $SiO_2$ containing silicon oxyfluoride glass has at least 0.5 wt. % Fluorine. In an alternatively preferred embodiment the silicon oxyfluoride glass has a fluorine content in the range of 0.1 to 0.4 weight percent.

In a preferred embodiment measurements of the infrared transmission of glass at 2.7 microns is used to quantify the OH content of glass.

Figure 2:
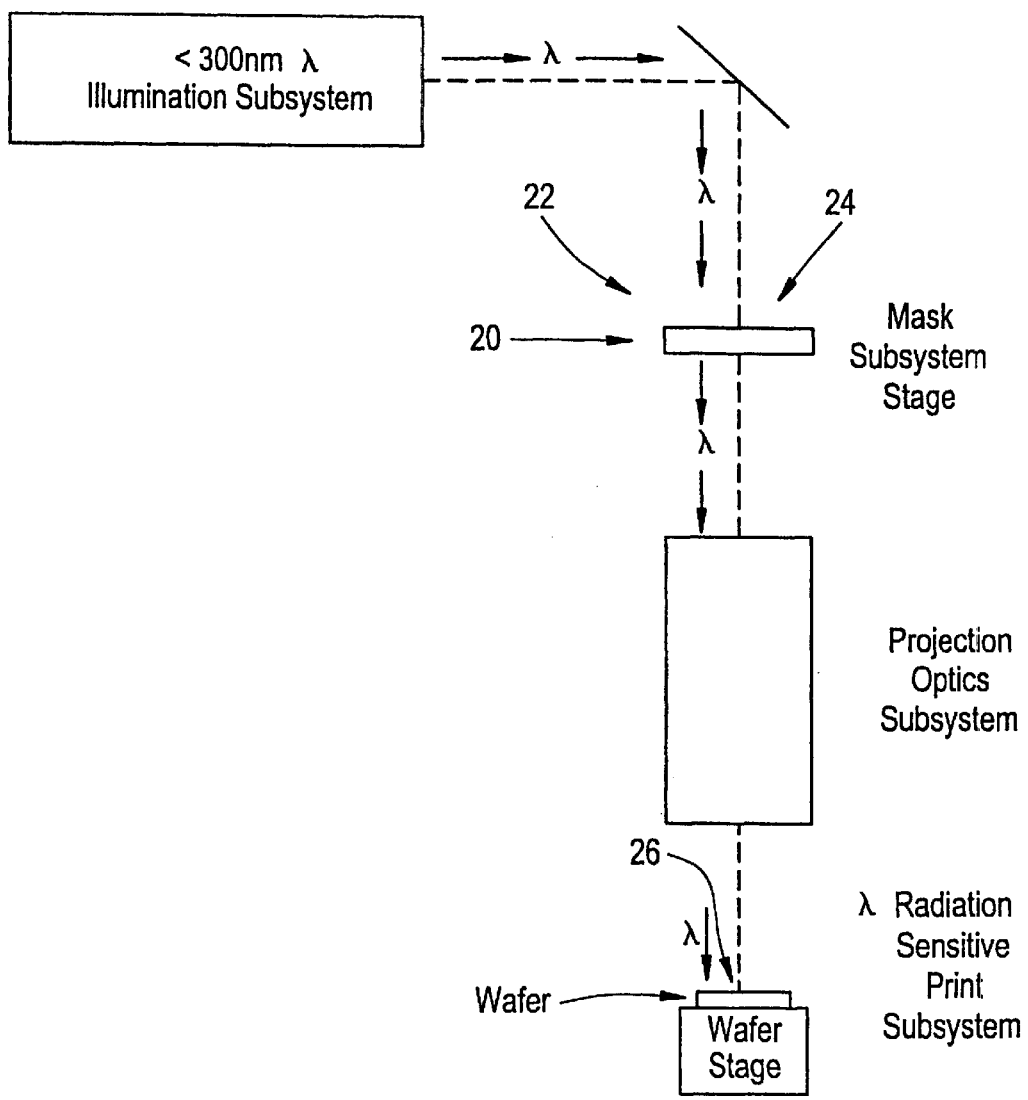

An exemplary embodiment of a dry high purity direct deposit vitrified silicon oxyfluoride glass lithography photomask substrate of the present invention is shown in FIGS. 1–2 and is designated generally throughout by reference numeral 20.

Figure 3:
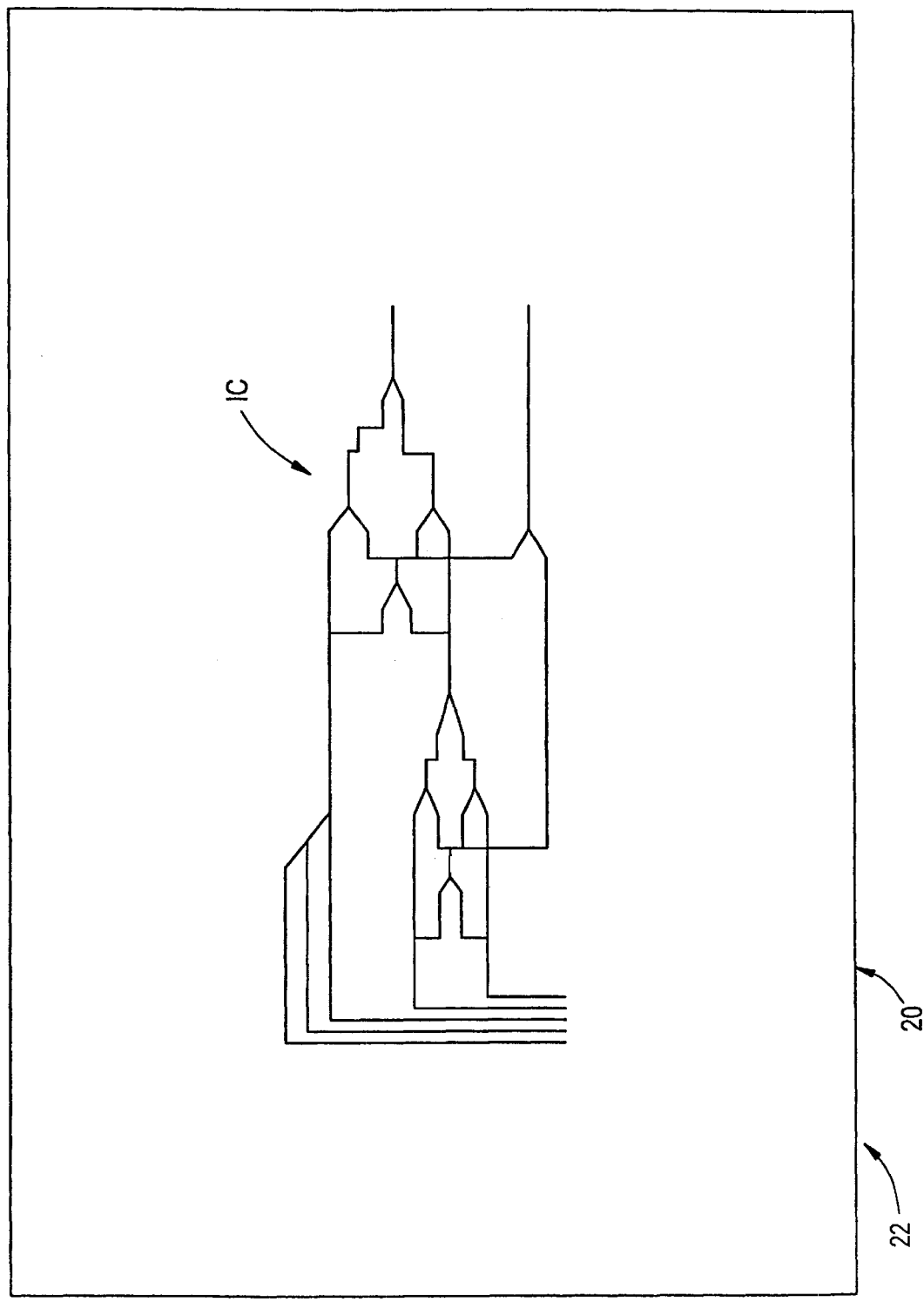
Figure 4:
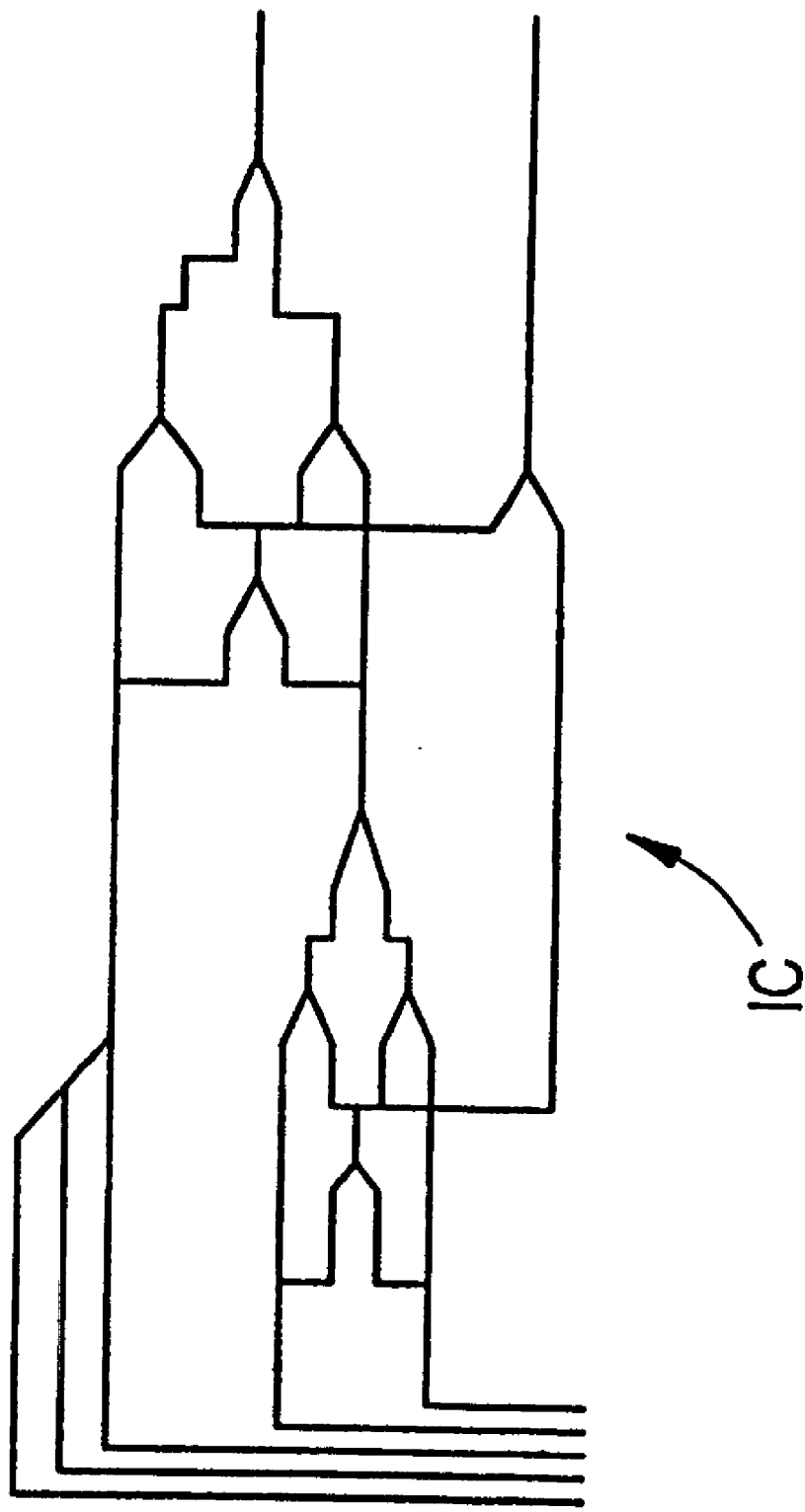
Figure 5:
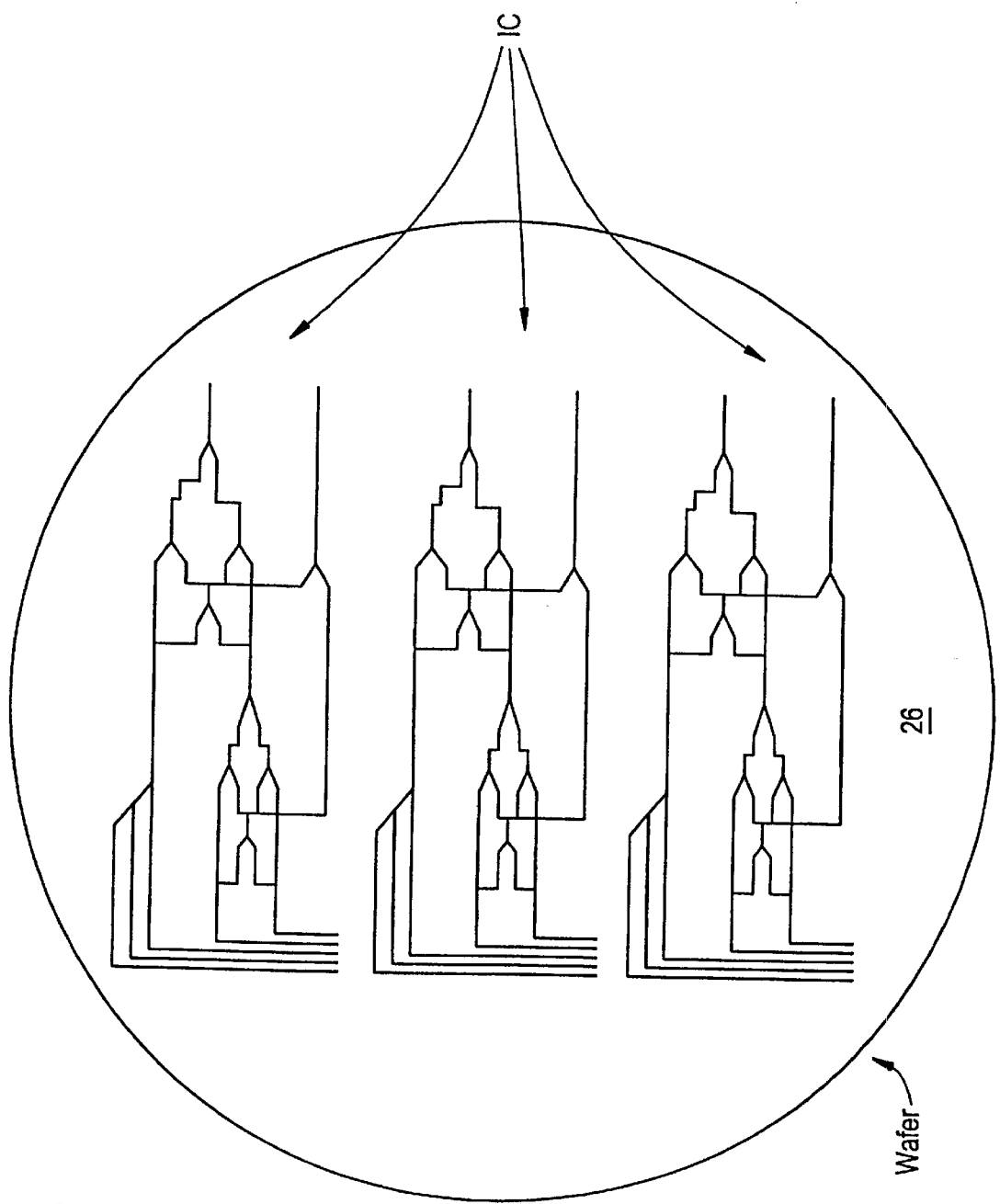
Figure 6:
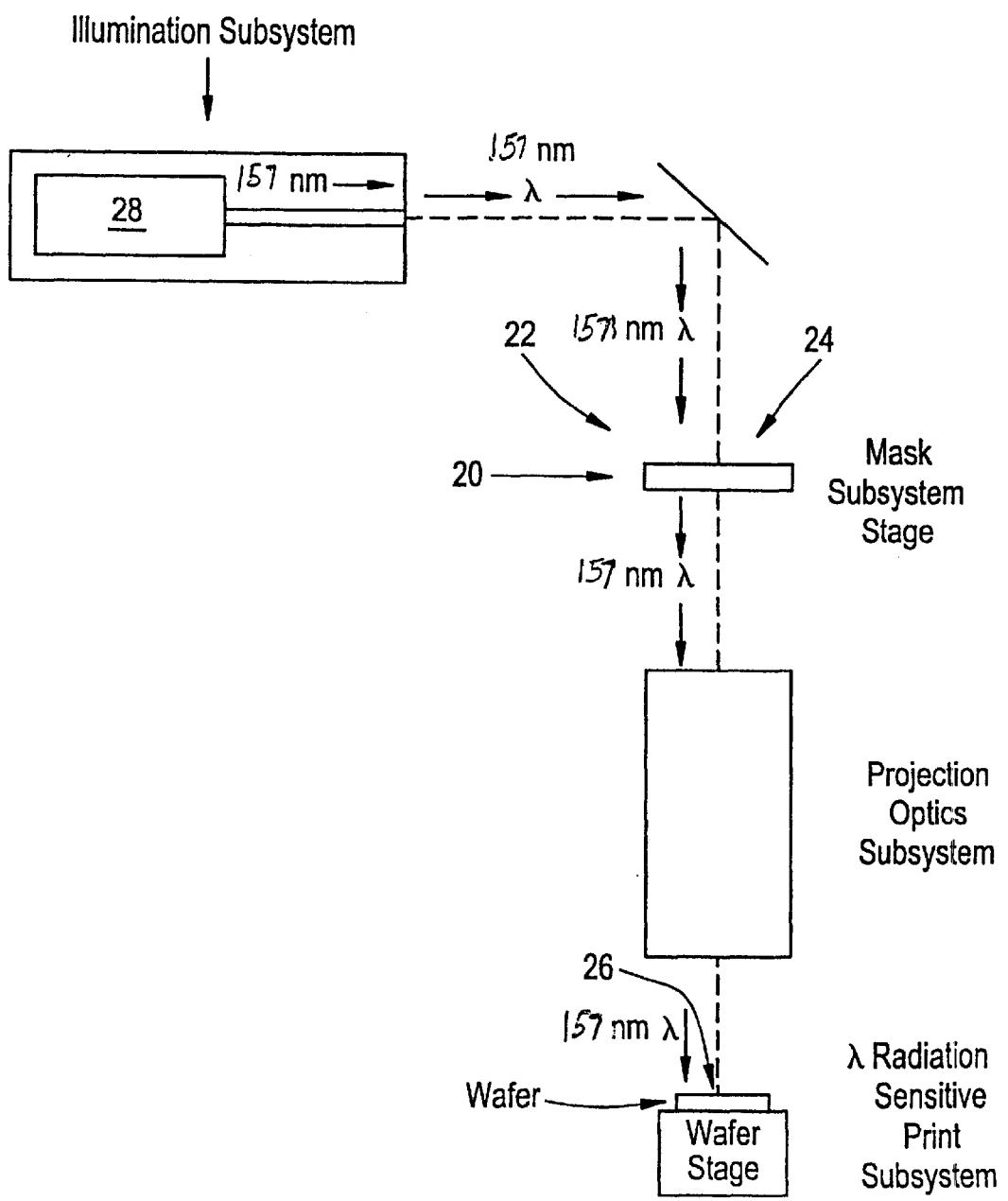

As shown in FIG. 2, in accordance with the invention, the present invention for a photolithography method for producing lithography patterns includes the step of providing an illumination subsystem for producing and directing a <300 nm UV radiation λ. Preferably λ<200 nm, and most preferably λ<193 nm. The method includes providing a mask subsystem with a mask stage and a transmitting photolithography mask 22 which includes a dry high purity direct deposit vitrified silicon oxyfluoride glass wafer 20 with photolithography pattern depictions 24. The method includes providing a projection optics subsystem and providing a λ radiation sensitive print subsystem, which includes a radiation sensitive print media 26. As shown in FIG. 2, the method further includes aligning the illumination subsystem, the mask subsystem, the projection optics subsystem, and the radiation sensitive print subsystem, and illuminating mask 22 with the radiation λ with radiation λ traveling through glass 20 such that the photolithography pattern depictions IC of glass wafer mask 22 are projected onto media 26. FIG. 3 shows mask 22 with photolithography pattern depictions IC on direct deposit vitrified silicon oxyfluoride glass substrate 20. Photolithography IC patterns such as shown in FIG. 4 are formed from mask 22 with radiation λ transmitted through glass 20, transmitted through the projection optics and with the IC pattern projected onto integrated circuit wafer media 26 as shown in FIG. 5. The inventive photolithography method includes transmitting photolithography pattern depictions in the form of UV photons with <193 nm wavelengths through the glass wherein attenuation of the radiation λ photolithography light is inhibited. In a preferred embodiment, the method includes providing an $F_2$ excimer laser 28 which produces UV radiation λ and λ includes a laser emission wavelength of 157 nm as shown in FIG. 6.

In a preferred embodiment, below 193 nm VUV transmitting glass photomask substrate 20 for photolithography at wavelengths of about 157 nm is a dry high purity direct deposit vitrified silicon oxyfluoride glass with an OH content below 20 ppm by weight, a Cl content below 0.1% by weight, and a fluorine content in the range of 0.01 to 7 weight percent.

Preferably dry high purity direct deposit vitrified silicon oxyfluoride glass 20 has a fluorine content in the range of 0.01 to 2 weight percent, more preferably a fluorine content in the range of 0.01 to 0.5 weight percent, and most preferably a fluorine content in the range 0.1 to 0.4 weight percent. Preferably dry high purity direct deposit vitrified silicon oxyfluoride glass 20 has a Cl content≦0.08% by weight, more preferably a Cl content≦0.06% by weight, more preferably a Cl content≦0.04% by weight, more preferably a Cl content≦0.03% by weight, more preferably a Cl content≦0.02% by weight. In preferred embodiments dry high purity direct deposit vitrified silicon oxyfluoride glass 20 has a Cl content below 5 ppm, more preferably a Cl content below 1 ppm, and most preferably the direct deposit vitrified silicon oxyfluoride glass is Cl-free with no detectable chlorine.

Preferably dry high purity direct deposit vitrified silicon oxyfluoride glass 20 has an OH content below 10 ppm by weight, and more preferably an OH content below 1 ppm by weight.

Preferably the dry high purity direct deposit vitrified silicon oxyfluoride glass has a hydrogen content below $1\times10^{17}$ molecules/$cm^3$. Preferably dry high purity direct deposit vitrified silicon oxyfluoride glass has a Fe content no greater than 0.00004% by weight. Preferably the dry high purity direct deposit vitrified silicon oxyfluoride glass has a Zr content no greater than 0.00004% by weight.

In a preferred embodiment dry high purity direct deposit vitrified silicon oxyfluoride glass 20 contains a plurality of intersticial $O_2$ molecules, preferably with an $O_2$ concentration of at least $10^{15}$ $O_2$ mole/cc, preferably $\geq 10^{16}$ $O_2$ moles/cc, preferably $\leq 10^{20}$ $O_2$ moles/cc, and most preferably in range of about $10^{16}$ to $10^{10}$ $O_2$ moles/cc.

In a preferred embodiment of the invention glass substrate 20 is a non-piece-annealed glass wafer in that the glass piece 20 has not been annealed in its glass wafer substrate physical form state. In a preferred embodiment the glass is annealed in a preform physical state that is distinct from and larger than the glass wafer glass substrate piece, preferably with the glass being annealed as a glass preform disk 32 (FIG. 7), with the physical size of the glass preform that is annealed being considerably larger than that of glass wafer 20 (much larger volume and much larger longest dimension; at least twice, preferably at least thrice, more preferably at least quadruple).

Figure 7:
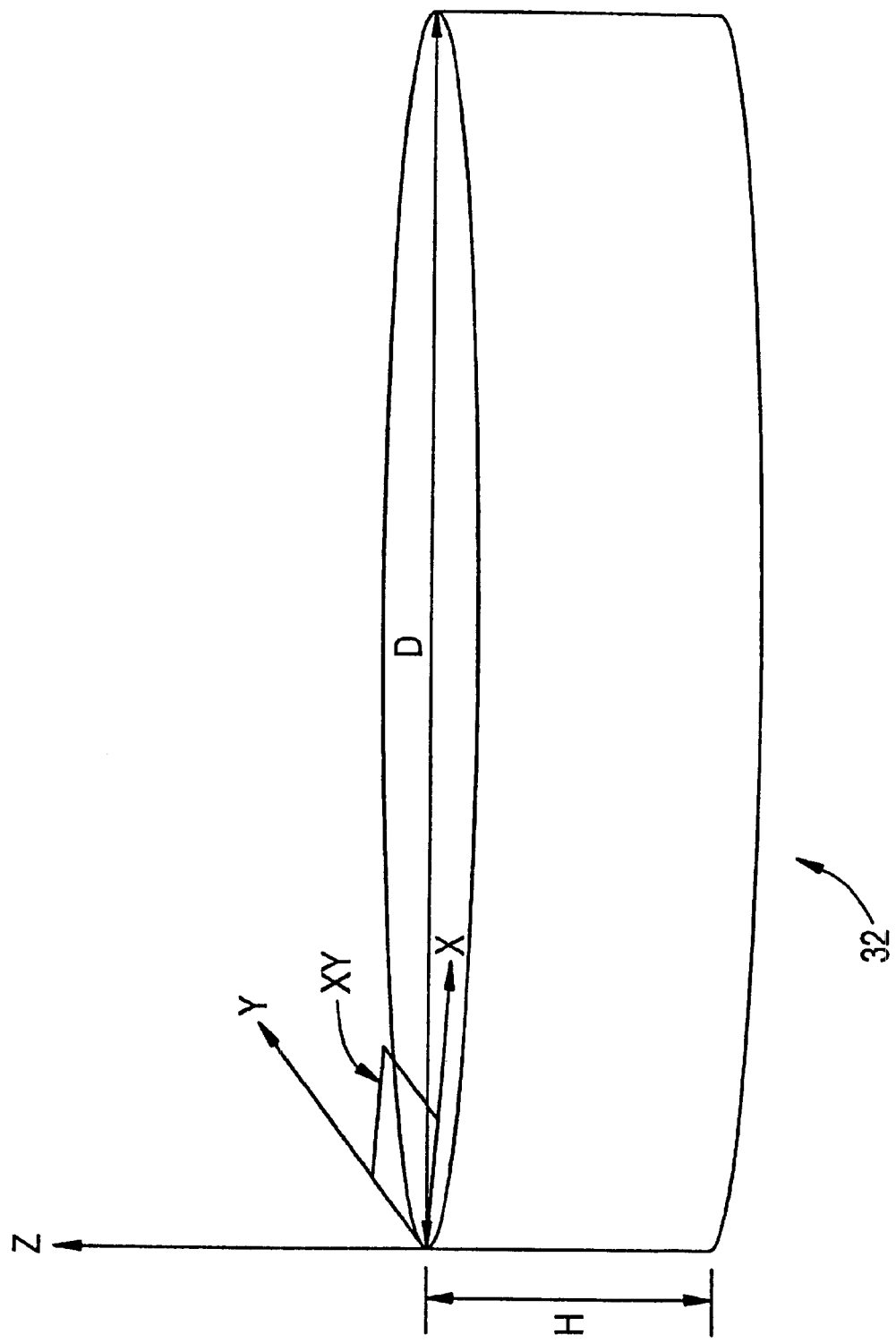
Figure 8A:
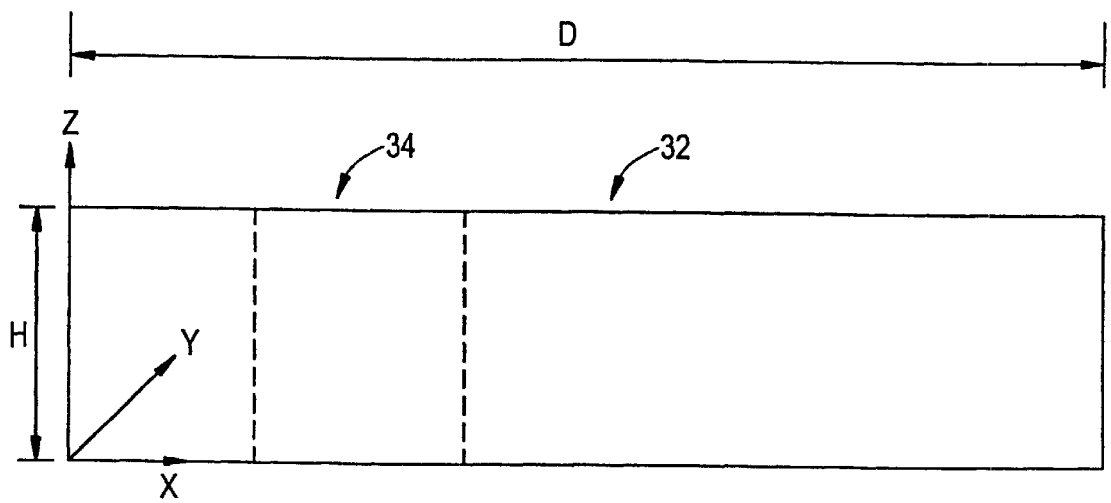
Figure 8B:
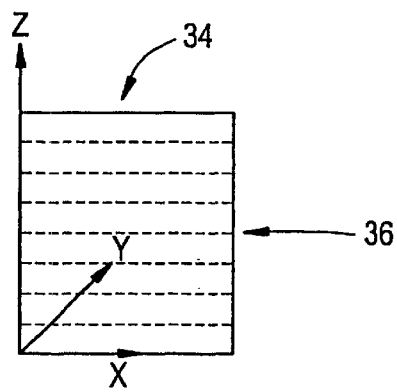
Figure 8C:
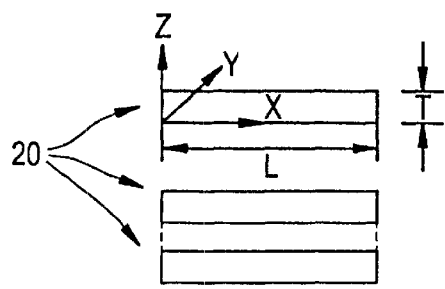

As shown in FIG. 1 a lithography photomask blank glass substrate 20 has a longest dimension length L. As shown in FIG. 7 direct deposit vitrified silicon oxyfluoride glass preform disk 32 has a preform disk diameter D and a preform disk height H with D>H. As shown in FIG. 7, the preferred direct deposit vitrified silicon oxyfluoride glass preform disk 32 has a height H and a diameter D, with diameter D lying in plane xy defined by preform disk x-axis and preform disk y-axis, and the x-axis and the y-axis oriented normal to preform disk height H. Disk height H is in alignment with the preform disk z-axis. As shown in side view process flow FIGS. 8a–c, the method includes identifying an inclusion free region 34 in preform disk 32 with preform disk inclusion free region 34 including glass free of inclusions having diameters greater than 1 μm. As shown in FIGS. 8a and 8b preferably the invention includes maintaining the preform disk x-axis, y-axis, and z-axis orientation while removing inclusion free region 34 from preform disk 32 to provide a photomask blank preform 36 having a photomask blank preform x-axis in alignment with the preform disk x-axis, a photomask blank preform y-axis in alignment with the preform disk y-axis, and a photomask blank preform disk z-axis. As shown in FIGS. 8b, 8c and 1, the method includes forming photomask blank preform 36 into a lithography photomask blank 20 having a longest dimension length L. In a preferred method of the invention, lithography photomask blank 20 has a thickness T, a lithography photomask blank x-axis, a lithography photomask blank y-axis, and a lithography photomask blank z-axis with the lithography photomask blank x-axis and the lithography photomask blank y-axis in alignment with the photomask blank preform x-axis and the photomask blank preform y-axis. The longest dimension length L of lithography photomask blank 20 lies in plane xy defined by photomask blank x-axis and y-axis and the lithography photomask blank thickness T is aligned with the lithography photomask blank z-axis and normal to the photomask blank x-axis and y-axis and the thickness T is less than L. Preferably T is much smaller than L, more preferably 10T<L.

With the inventive method the direct deposit vitrified glass preform 32 has a flat geometry, preferably a flat disk shape versus a tall columnary shape where the height in the z axis orientation is larger than the base dimension in the xy plane. Such a preform with a flat geometry shape versus a tall geometry shape provide a preferred glass body with uniform optical characteristics that provide improved lithography performance. In a preferred embodiment providing direct deposit vitrified glass preform disk 32 includes providing preform disk 32 with a longest dimension diameter D that is greater than or equal to twice the height H (D≧2H), more preferably with D≧3H, and most preferably D≧4H.

Figure 9:
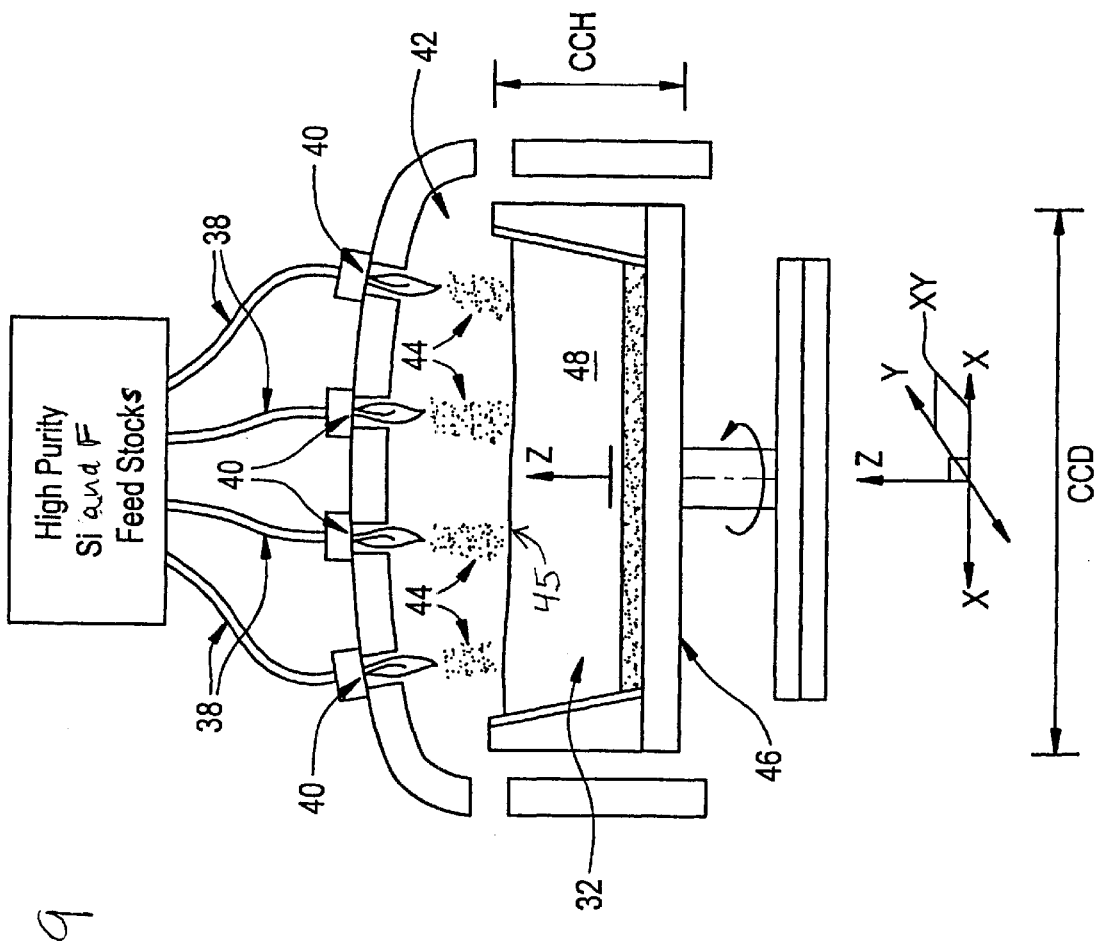
Figure 10:
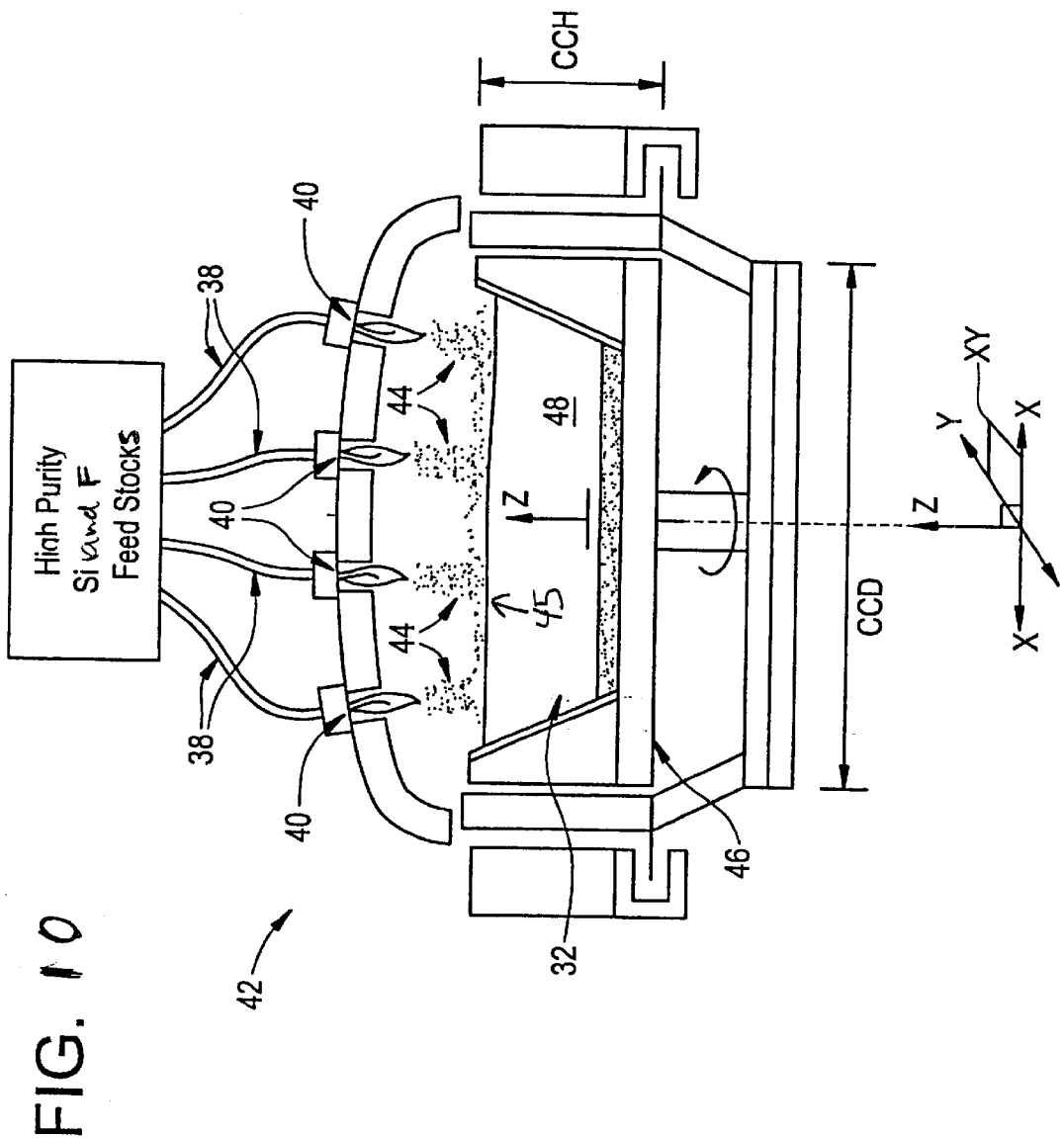

The method of making below 193 nm VUV transmitting glass photomask substrate 20 includes making a direct deposit vitrified silicon oxyfluoride glass body 32. FIG. 9 and FIG. 10 show methods of making and providing direct deposit vitrified glass preform disk 32. In a preferred embodiment the high purity Si glass precursor feedstock is delivered in vapor form through delivery conduits 38 to carbon monoxide conversion site burner carbon monoxide combustion flames 40 at heat containing direct deposit conversion site furnace 42 which converts the Si and F containing feedstocks into dry silicon oxyfluoride glass soot 44 which is directed at and deposited on direct glass deposition surface 45, which preferably is contained in revolving horizontally oriented collection cup 46 and soot 44 is concurrently directly deposited vitrified consolidated into high purity dry silicon oxyfluoride glass body 48. Preferably heat containing direct deposit conversion site furnace 42 is constructed of refractory bodies made from aluminum dioxide which have been halogen cleansed of contamination contents. Furnace 42 including cup 46 is preferably comprised of halogen treated cleansed aluminum dioxide refractory blocks which are free of contaminants and preferably which are obtained by removing the contaminants prior to forming glass, such as carbo-chlorination with a halogen containing cleaning/contaminant removing atmosphere. Preferred low contaminant bubbled alumina refractories are disclosed in PCT Application WO 01/17919, Sep. 8, 2000, entitled Pure Fused Silica, Furnace And Method by Kotacska et al., which is incorporated by reference. Rotating cup 46 is oriented horizontally (parallel to xy plane, normal to z axis), preferably in addition to rotation cup 46, cup 46 is moved in the xy plane using an x–y oscillation table with xy oscillation movement patterns. As shown in FIG. 10 it is preferred to minimize and inhibit changes in gas flow and the environment within furnace 42 so that a consistent glass body 48 is produced. A preferred direct deposit furnace is disclosed in U.S. Pat. No. 5,951,730, Sep. 14, 1999, by Paul Schermerhorn, which is incorporated by reference. The temperature within heat containing furnace 42 is maintained at a high temperature to ensure consolidation of soot 44 into glass body 48 as it is deposited, preferably the operating temperature of furnace 42 and glass body 48 is at least 1500° C., more preferably at least 1600° C., and most preferably at least 1650° C.

Along with such high temperatures which allow the glass body to flow in a preferred embodiment cup 46 is constructed with sloping side walls as shown in FIG. 10 which are not as steep as those in FIG. 9 and promote beneficial movement and flow of the glass. Preferred collection cup containment vessels are disclosed in U.S. Pat. No. 5,698,484, Dec. 16, 1997 by John Maxon, which is incorporated by reference. Preferably horizontally oriented collection cup 46 has a collection cup height CCH and a collection cup diameter CCD, with CCH>H and CCD>D. Providing glass preform disk 32 includes discarding the periphery of glass body 48, particularly the periphery of glass body 48 in contact with cup 46, so that photomask blanks originate from the non-outer periphery parts of glass body 48. As shown in FIGS. 9–10, glass body 48 is preferably contained within direct deposit collection cup 46. In addition to containing the physical form of the flowable glass, collection cup 46 protects the glass body from changes and influences of the surrounding environment and most preferably inhibits heat loss from the glass body in that cup 46 is formed from a refractory insulating material, and particularly reduces heat loss from the sides and bottom of glass body 48 with heat being generated above glass body 48 by the carbon monoxide flames of carbon monoxide combustion burners 40, and from auxiliary heat sources such as carbon monoxide combustion heat source burners that are also located in furnace conversion site 42 above glass body 48 and cup 46. In a preferred embodiment, the invention includes continuously depositing soot 44 in cup 46 while concurrently consolidating the soot in order to direct deposit vitrify a fused glass body while maintaining the temperature of the building up body at a temperature of at least 1500° C. Built up glass body 48 is preferably maintained at such temperature needed for consolidation vitrification (consolidation vitrification temperature) with the temperature of the entire glass body being substantially homogeneous and even throughout. Preferably such temperatures are maintained by minimizing heat loss from the glass body 48 throughout its production. The flat disk geometry such as with glass preform disk having D≧2H, preferably helps to minimize heat loss from the surfaces of glass body 48. The formation of such flat disk shaped bodies, preferably within an insulating containing cup, minimize heat loss through the side of the body opposite the heat source (bottom of body 48 is opposite of heat sources on top of furnace 42) and from the sides of body 48. Such flat disk shapes beneficially inhibit heat loss through the bottom and sides compared to geometry's based on long tall columns. As shown in FIGS. 9–10, it is preferred that soot 44 is directed at deposition surface 45 and travels down into cup 46 along a downward deposition path from the carbon monoxide combustion flames of carbon monoxide burners 40, and revolving cup 46 is rotated in a plane of rotation substantially perpendicular to the downward deposition path of soot 44. The plane of rotation of cup 46 is parallel with the plane defined by the preform disk x-axis and the preform disk y-axis. In addition to revolving motion in the rotation plane parallel to the xy plane, cup 46 is translated in an oscillation motion in such a xy parallel plane preferably utilizing oscillation rotation patterns as disclosed in U.S. Pat. No. 5,696,038, Dec. 9, 1997, Boule Oscillation Patterns In Methods of Producing Fused Silica Glass by John Maxon, which is incorporated by reference.

In a preferred embodiment glass preform disk 32 is annealed inside a carbon monoxide direct deposit furnace 42 after the formation of glass body 48 is completed and production and deposition of soot 44 is ended. In a preferred method of making lithography photomask blank 20, the glass is not annealed after removal from preform disk 32 in that photomask blank preform 36 and individual blanks 20 are not annealed. In the preferred embodiment any birefringence present in the glass is reduced in the large physical size of preform disk 32 and body 48 and not during processing after the preform disk.

Forming photomask blank preform 36 into lithography photomask blanks 20 preferably includes cutting a plurality of photomask blanks from preform 36 and polishing the cut photomask blanks. The invention further includes forming a lithographic pattern on photomask blank 20 and transmitting below 193 nanometer wavelength radiation through said photomask blank.

Figure 11:
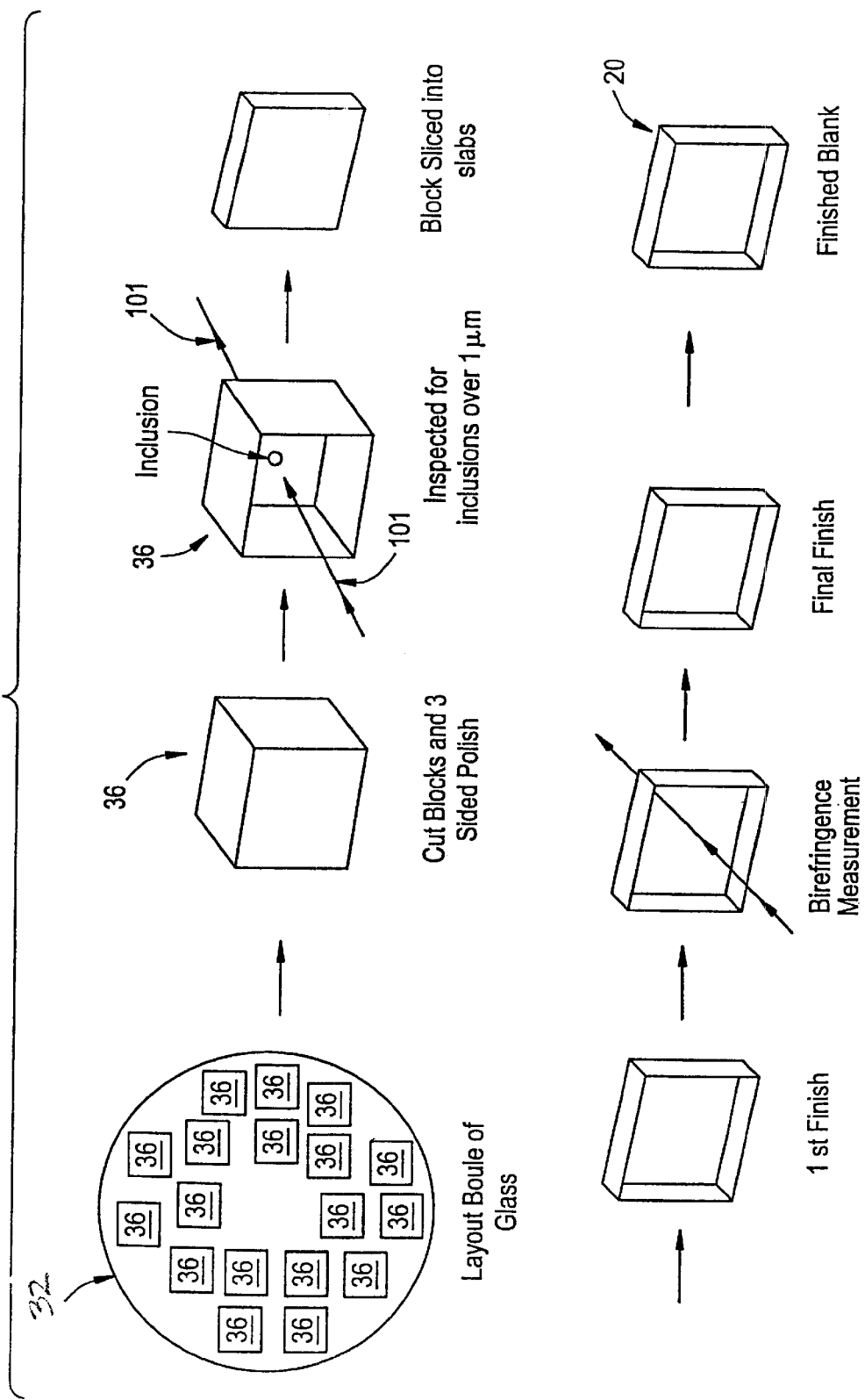

In a preferred practice of the invention preform disk 32 has a diameter greater than 20 inches (50 cm) such as D about 3 to 5 feet (0.91 to 1.5 meters) and a height H of about 6 to 10 inches (15 to 25 cm) with the mask blanks 20 made therefrom having a longest dimension L<12 inches (30 cm) such as blank dimensions of about 10 inches×10 inches (25 cm×25 cm), about 9 inches×9 inches (22.8 cm×22.8 cm) and about 6 inches×6 inches (15 cm×15 cm), with thickness T of about ¼ inch (0.63 cm). Numerous mask blanks 20 can be cut from the larger preform disk 32, with the large preform disk size providing improved lithography performance, particularly compared to photomask substrates formed from small preform columns that have near net preform dimensions close to the dimensions of the photomask substrates. FIG. 11 illustrates a process flow of a preferred method of making mask blanks 20. Preform disk 32 is provided such as shown in FIGS. 9–10, with a carbon monoxide conversion flame direct deposit vitrification lay down process and employing oscillation/rotation of cup 46. The location of photomask blank preforms 36 is layed out on preform disk 32, preferably with the center of disk 32 avoided. As shown in FIG. 11 the location layout of photomask blank preforms 36 is preferably staggered to avoid any human eye visually detectable inclusions. A non-staggered checker board aligned column-row formations can be used without inspecting for detectable inclusions in preform disk 32 with inclusion containing glass discarded later in the process. After the location layout of photomask blank preforms 36 are determined the photomask blank preform blocks 36 are cut out of preform disk 32. A representative photomask blank preform block 36 has a square base of about 6½ inch×6½ inch (16.5 cm×16.5 cm) and a height of about 5–6 inches (12 cm to 15 cm). The cut out blocks 36 are polished on three sides to allow inspection and mapping of the glass interior. The interior is inspected using the three polished sides by transmitting light through the two opposing polished sides in order to identify, mark and map any inclusions over 1 μm in size which may be in the interior volume of the glass. An optical measurement system is preferably used to scan an inspection laser light beam (HeNe scan beam) 101 through the volume of block 36 to identify inclusions, with the inclusion observed through the third polished side, so that the location of the inclusion can be mapped and marked for subsequent removal. A method and system such as disclosed in U.S. Ser. No. 09/458,561, filed Dec. 9, 1999, entitled Automated System For Measurement Of An Optical Property, Attorney Docket No. Priestley-1, by Richard Priestley, which is incorporated by reference, can be used. Block 36 is then sliced into blank slabs, with the slabs sliced so that identified inclusions are removed. Inclusions are cut around with the cut blank slabs having a thickness of about 0.4–0.5 inches (1–1.3 cm). The cut blank slabs are then pre-finished with chemical-mechanical finishing, flatness lap, flat plate flatness polishing and edge polishing to provide a pre-finished mask blank. The pre-finished mask blank is measured for optics. In an alternative embodiment the optics of the glass can be measured in the block form as done for inclusion inspection. A method and system such as disclosed in U.S. Ser. No. 09/458,561, filed Dec. 9, 1999, entitled Automated System For Measurement Of An Optical Property, Attorney Docket No. Priestley-1, by Richard Priestley, which is incorporated herein, can be used for optic measurements. The pre-finished mask blank is then given a final finish to provide finished glass substrate photomask blank 20. The final finish preferably includes chemical mechanical polishing to a super polish below 5 angstroms finish and flatness, cleaned and packaged for incorporation into a mask 22.

Figure 12:
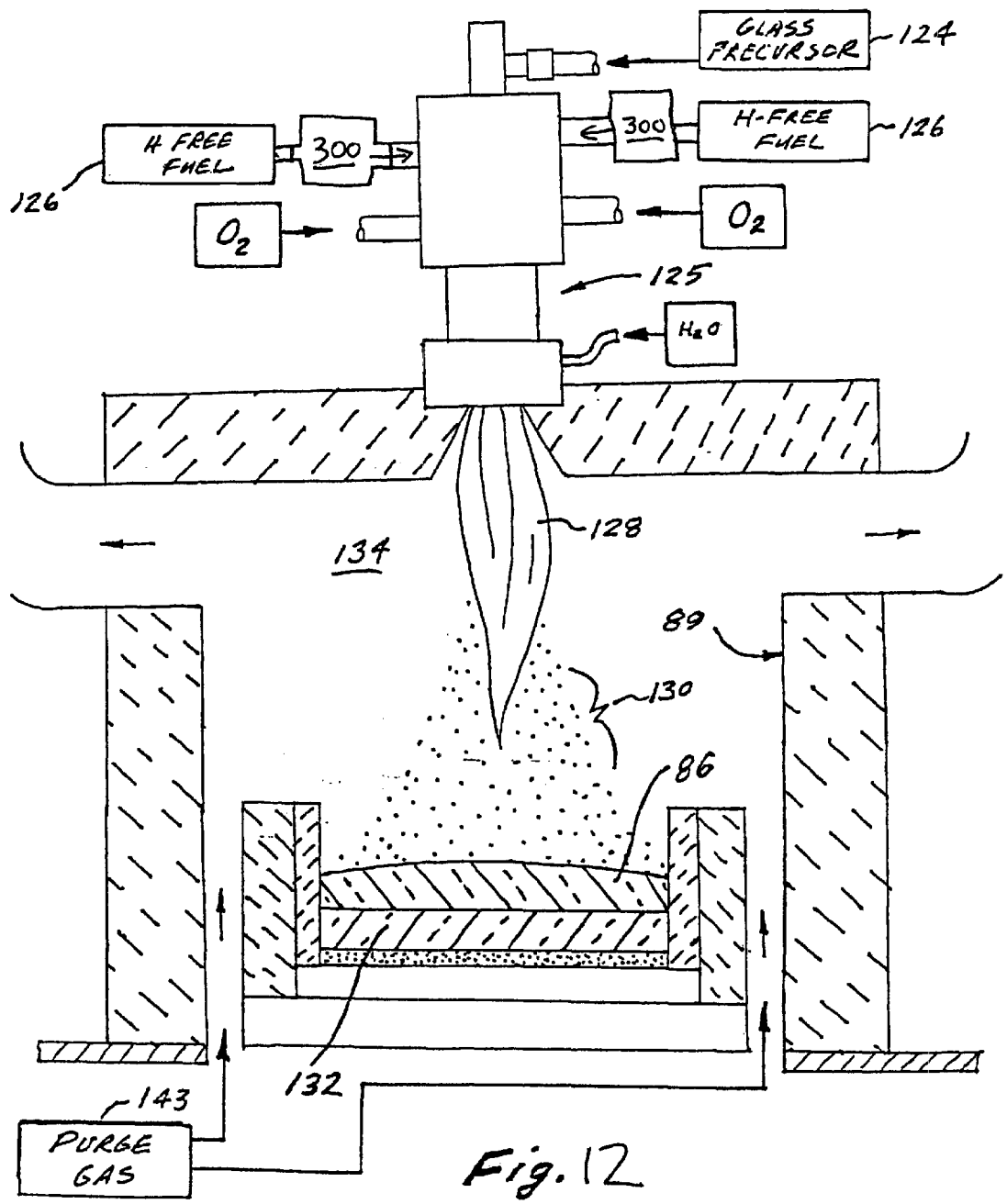
Figure 13:
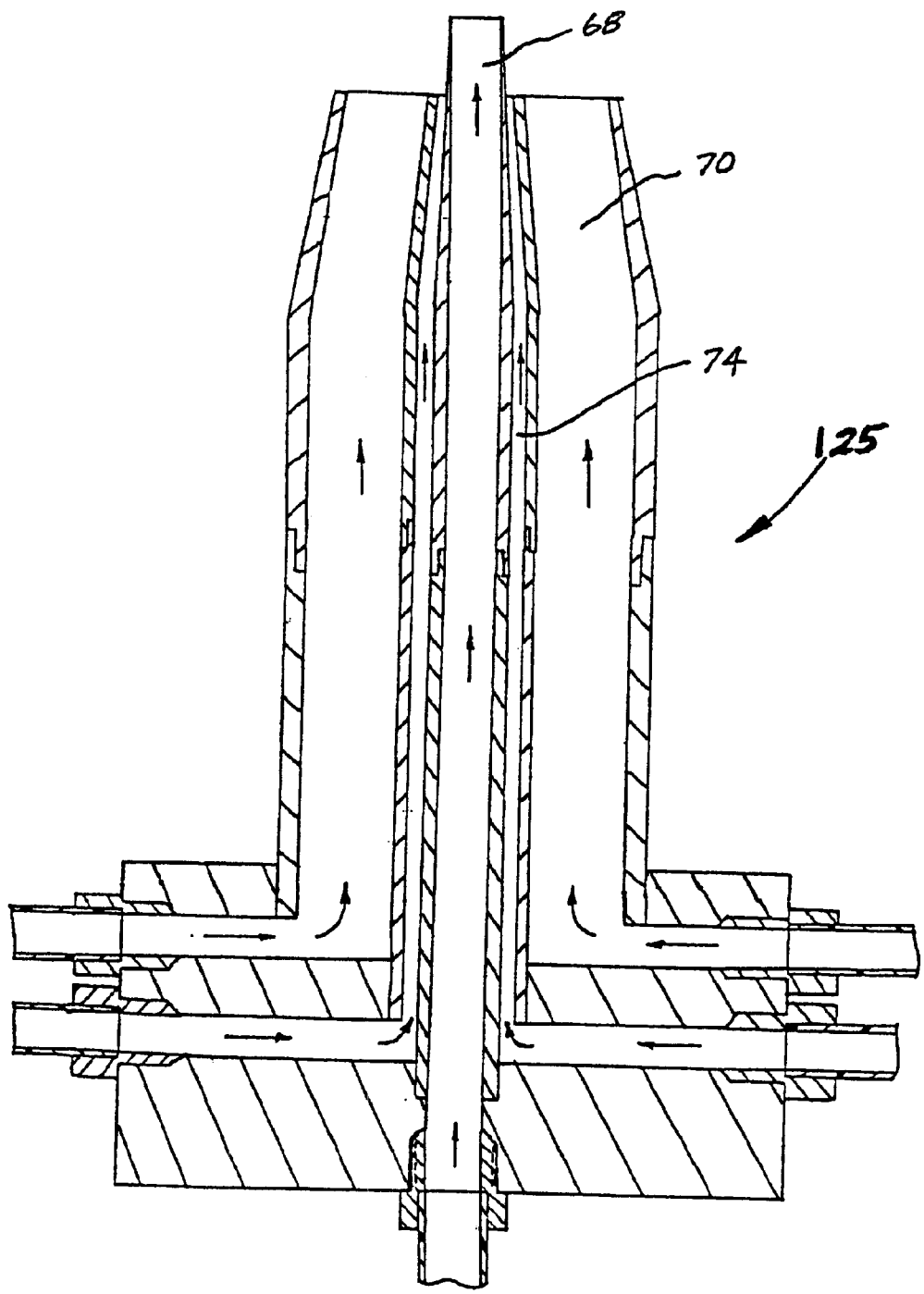

As shown in FIG. 12, preferably to obtain sufficient heat from the dry CO flame, substantially hydrogen-free CO fuel 126 and glass feedstock precursor 124 are preferably supplied at a predetermined flow ratio. In particular, to generate sufficient heat, the flow of fuel to the flow of glass precursor 124 should be greater than 20:1. This is accomplished, by proper sizing of the various passages within the combustion burner 125. One preferable combustion burner is illustrated in FIG. 13. The CO combustion burner adapted for combusting substantially hydrogen-free gas shall be referred to herein as a "dry combustion burner." The dry combustion CO burner 125 includes a center fume tube 68, formed as a slender tube, and is adapted to supply the gaseous glass feedstock precursor. Preferably surrounding the fume tube 68 is an inner shield passage 74 that is adapted to carry oxygen. Oxygen, a combustion supporting gas, is supplied in a ratio of fuel to combustion supporting gas of about 2:1. Surrounding the fume tube 68 and inner shield 74 is the fuel passage 70 adapted to carry the large volumes of substantially hydrogen-free CO fuel. Although not shown exactly to scale, it is apparent that the cross-sectional area of the fuel passage 70 is much larger than of the fume tube 68. Because, for example, carbon monoxide contains less heat when ignited, higher flows are required as compared to methane. This is designed such that the glass precursor 124 may be supplied at a first flow rate to a center fume passage 68 of the combustion burner 125 and that the substantially hydrogen-free fuel 126 may be supplied at a flow rate at least 20 times the first flow rate thereby enabling generation of sufficient heat to oxidize the precursor. The burner 125 may include multiple input ports for supplying the substantially hydrogen-free fuel 126 and the combustion supporting oxygen 21 thereby providing more uniform flow distribution in the annular shaped passages.

Fluorine may be incorporated into the soot in another embodiment of the invention. There are several ways that this may be accomplished in accordance with the invention. First, the fluorine may be included in the precursor, such as when a chlorofluorosilane is used for the precursor 124. In this scenario, the precursor 124 is supplied as a gas to the fume tube 68 and oxidized by the CO flame thereby producing fluorine doped soot. Alternatively, some fuel or oxygen may be supplied with the substantially hydrogen-free fuel.

Figure 14:
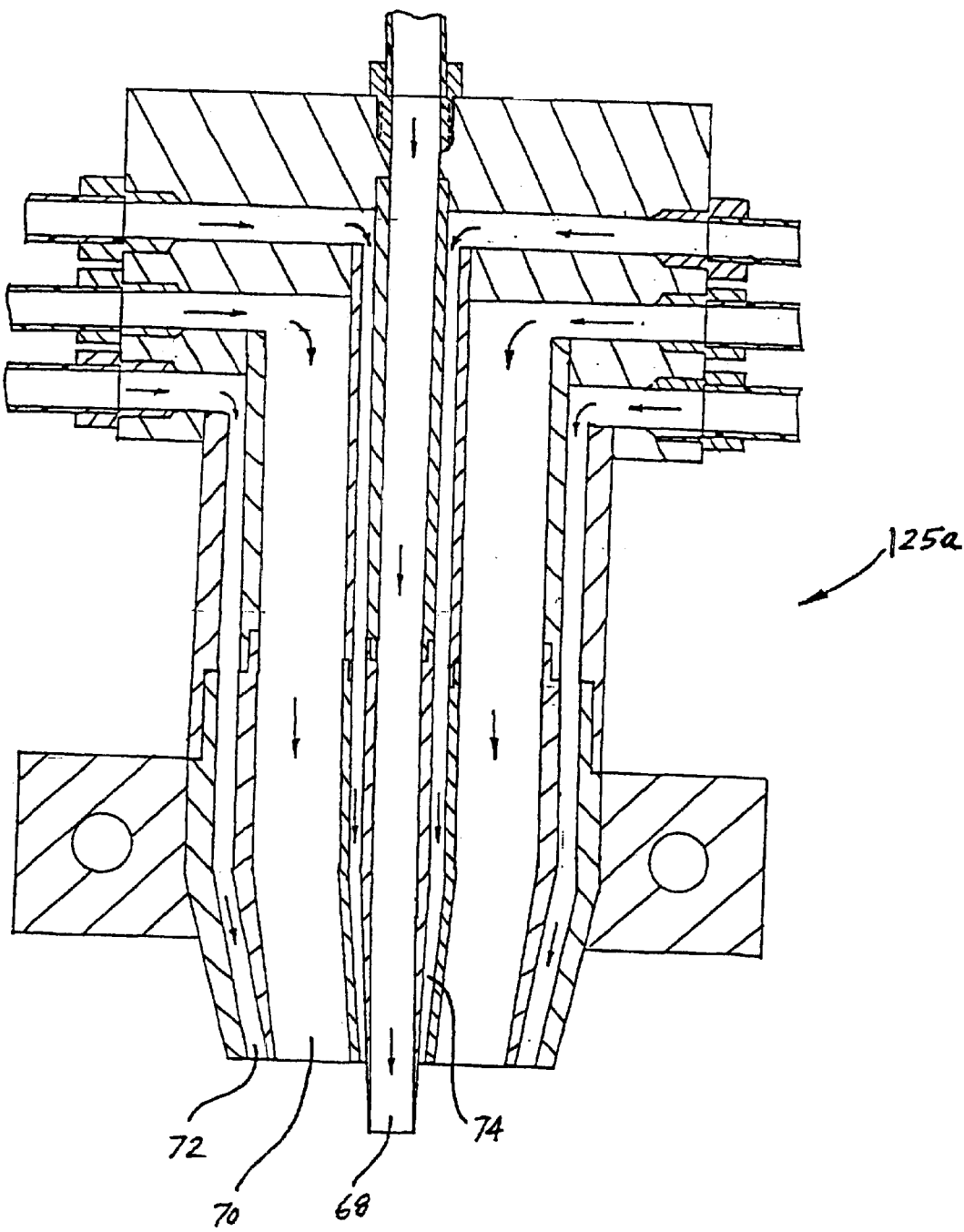

A second way of introducing fluorine is by flowing fluorine or a fluorine-containing compound such as of $F_2$, $CF_4$, $C_2F_6$, $SF_6$, $NF_3$, $SiF_4$ or combinations thereof in gaseous feedstock form into a shield included within the combustion burner. FIG. 14 illustrates a burner 125a that may be utilized to produce silicon oxyfluoride soot. Fluorine or the fluorine-containing feedstock compound is supplied in gaseous form to outer shield passage 72 surrounding the fuel passage 70. A water cooling jacket may be utilized surrounding the fuel passage. A preferred embodiment of the CO combustion burner has a center tube 68 adapted to provide a substantially hydrogen-free glass precursor into a flame region, the center tube located along a central axis of the burner 125, 125a (FIGS. 13–14); an inner shield unit 74 adapted to provide oxygen into the flame, the inner shield unit radially displaced from the central axis of the burner, a fuel unit 70 radially displaced from the central axis of the burner and adapted to provide a substantially-hydrogen free fuel; and an outer shield unit 72 adapted to provide a fluorine containing gas enshrouding the flame, the outer shield region radially displaced from the central axis of the burner and positioned outside the inner shield unit and the fuel unit, the burner being adapted for producing substantially water-free, fluorine doped silica.

In accordance with illustrated embodiment of FIG. 12, the substantially hydrogen free fuel may be utilized for making a glass article, such as a disc of glass 86. Silicon-containing gas feedstock molecules are reacted in CO flame 128 to form soot particles. These particles 130 are deposited on the hot direct deposition surface of a body 132 where they consolidate into a very viscous fluid (deposited and virtually simultaneously vitrified) which is later cooled to the solid state.

According to another embodiment of the invention, a method for producing a dry vitrified glass article is provided. The method preferably comprises the steps of generating heat from a combustion burner 125 having a flame 128 that is produced by igniting a substantially hydrogen-free fuel 126, hydrogen-free CO fuel flame 128 being the source of heat, flowing a glass precursor 124 into the flame 128 to produce silica containing soot 130, and depositing the silica containing soot onto a deposition surface substrate 132 and substantially simultaneously vitrifying consolidating the soot to form the vitrified glass article 86. In accordance with a preferred embodiment, the soot is deposited onto a substrate 132 that is itself a silica-containing glass member, and most preferably a dry glass disc of the invention. By utilizing the substantially hydrogen free fuel in accordance with the invention, the vitrified glass article 86 contains water (OH) in amount less than about several ppm. In the illustrated embodiment, the step of depositing takes place within a heat containing furnace chamber 89. Preferably, a purge gas, such as nitrogen, is provided into the chamber such that a substantially water free environment is provided. Generally, it is desirable to provide a pressurized atmosphere in the chamber 89 greater than an atmospheric pressure outside of the chamber.

In a preferred embodiment, providing a supply of carbon monoxide to said carbon monoxide combustion burner to form a carbon monoxide combustion reaction flame includes providing a high purity carbon monoxide supply gas and passing said high purity carbon monoxide supply gas through an inline CO purifier filter 300 upstream of said carbon monoxide combustion burner. The inline CO purifier filter 300 upstream of said carbon monoxide combustion burner removes moisture, iron, and contaminating metals from the high purity carbon monoxide being delivered to the burner to ensure a high purity flame and resulting high purity glass formed therefrom. A CO purifier filter such as Waferpure® Micro/Mini-XL/Megaline Gas Purifiers brand CO purifier type from Millipore Corporation is a suitable CO purifier filter. Preferably the high purity carbon monoxide supply gas is at least 99.3% pure CO.

The method of making a below 193 nm VUV transmitting glass photomask substrate blank for photolithography at wavelengths of about 157 nm, includes providing a hydrogen-free fuel carbon monoxide combustion burner; providing a heat containing direct deposit furnace; providing a supply of carbon monoxide and a supply of oxygen to said carbon monoxide combustion burner to form a carbon monoxide combustion reaction flame, providing a direct glass deposition surface proximate said CO flame, supplying a Si-glass precursor feedstock and a F-glass precursor feedstock to said carbon monoxide combustion burner wherein said Si-glass precursor feedstock and said F-glass precursor feedstock is reacted in said CO flame into a silicon oxyfluoride glass soot directed at said glass deposition surface, and said soot is concurrently directly deposited and vitrified into a silicon oxyfluoride glass body. The method includes forming said directly deposited vitrified silicon oxyfluoride glass body into a photomask blank. Preferably supplying a Si-glass precursor feedstock includes supplying a chlorine-free Si-glass precursor feedstock wherein said directly deposited vitrified silicon oxyfluoride glass is a chlorine-free (preferably Cl<1 ppm) silicon oxyfluoride glass and said glass body is formed into a chlorine-free silicon oxyfluoride glass photomask blank. Preferably supplying a Si-glass precursor feedstock includes supplying a hydrogen-free Si-glass precursor feedstock wherein said directly deposited vitrified silicon oxyfluoride glass is a dry silicon oxyfluoride glass with an OH weight concentration<10 ppm OH and said glass body is formed into a dry silicon oxyfluoride glass photomask blank with an OH weight concentration<10 ppm OH. Most preferably supplying a Si-glass precursor feedstock includes supplying a chlorine-free hydrogen-free Si-glass precursor feedstock wherein said directly deposited vitrified silicon oxyfluoride glass is a dry chlorine-free silicon oxyfluoride glass with an OH weight concentration<10 ppm OH and said glass body is formed into a dry chlorine-free silicon oxyfluoride glass photomask blank with an OH weight concentration<10 ppm OH. In a prefered embodiment the chlorine-free hydrogen-free Si-glass precursor feedstock is silicon tetraisocyanate. Supplying a F-glass precursor feedstock preferably includes supplying a predetermined F-glass precursor feedstock flow wherein said directly deposited vitrified silicon oxyfluoride glass has a fluorine weight concentration in the range from 0.01 to 7 wt. % F, more preferably from 0.01 to 2 wt. % F, more preferably from 0.01 to 0.5 wt. % F. Preferably providing a supply of oxygen including providing a predetermined $O_2$ supply flow wherein said directly deposited vitrified silicon oxyfluoride glass contains $O_2$, preferably with a molecular $O_2$ concentration of at least $10^{15}$ $O_2$ mole/cc.

Providing a heat containing direct deposit furnace preferably includes providing a heat containing direct deposit furnace comprised of halogen treated cleansed aluminum dioxide refractory blocks and assembling said halogen treated cleansed aluminum dioxide refractory blocks to form the furnace, most preferably with the refractory blocks consisting essentially of aluminum dioxide. The heat containing direct deposit furnace is constructed of alumina refractory materials which has been pre-exposed to a reactive, halogen-containing gas to react with, and thereby cleanse the refractory of contaminating metals. Preferably the furnace crown containing and adjacent the CO burners consists essentially of aluminum dioxide, with the crown covering the consolidating glass mass.

Preferably the furnace cup consisting essentially of aluminum dioxide contains the consolidating glass mass. Preferably the aluminum dioxide refractory blocks are exposed to a reactive halogen-containing gas cleansing treatment. Preferably the aluminum dioxide refractory blocks are porous blocks having a porosity in the range of 25–70%, preferably with a bulk density<3.9 grams/cm$^3$, and more preferably with the aluminum dioxide refractory bulk density≧1.2 grams/cm$^3$.

The invention includes a method of making a below 193 nm VUV transmitting optical lithography glass for transmitting wavelengths of about 157 nm. The method includes providing a hydrogen-free fuel carbon monoxide combustion burner; providing a supply of carbon monoxide and a supply of oxygen to said carbon monoxide combustion burner to form a carbon monoxide combustion reaction flame, providing a direct glass deposition surface proximate said flame, supplying a Si-glass precursor feedstock and a said F-glass precursor feedstock to said carbon monoxide combustion burner wherein said Si-glass precursor feedstock and said F-glass precursor feedstock is reacted in said flame into a silicon oxyfluoride glass soot directed at said glass deposition surface, and said soot is concurrently directly deposited and vitrified into a silicon oxyfluoride glass body. Preferably supplying a Si-glass precursor feedstock includes supplying a chlorine-free Si-glass precursor feedstock wherein the directly deposited vitrified silicon oxyfluoride glass is a chlorine-free (Cl<1 ppm) silicon oxyfluoride glass. Preferably supplying a Si-glass precursor feedstock includes supplying a hydrogen-free Si-glass precursor feedstock wherein said directly deposited vitrified silicon oxyfluoride glass is a dry silicon oxyfluoride glass with an OH weight concentration<10 ppm OH. Preferably supplying a Si-glass precursor feedstock includes supplying a chlorine-free hydrogen-free Si-glass precursor feedstock wherein said directly deposited vitrified silicon oxyfluoride glass is a dry chlorine-free silicon oxyfluoride glass with an OH weight concentration<10 ppm, most preferably wherein said chlorine-free hydrogen-free Si-glass precursor feedstock is silicon tetraisocyanate. Supplying a F-glass precursor feedstock preferably includes supplying a predetermined F-glass precursor feedstock flow wherein said directly deposited vitrified silicon oxyfluoride glass has a fluorine weight concentration in the range from 0.01 t 7 wt. % F, more preferably 0.01 to 2 wt. % F, more preferably 0.01 to 0.5 wt. % F. Providing a supply of oxygen preferably includes providing a predetermined $O_2$ supply flow wherein said directly deposited vitrified silicon oxyfluoride glass has a molecular $O_2$ concentration of at least $10^{15}$ $O_2$ mole/cc.

The invention includes a method of making a homogeneous glass optical lithography element, with the method including providing a hydrogen-free fuel carbon monoxide combustion burner; providing a supply of carbon monoxide and a supply of oxygen to said carbon monoxide combustion burner to form a carbon monoxide combustion reaction flame, providing a direct glass deposition surface proximate said flame, supplying a Si-glass precursor feedstock and a dopant R-glass precursor feedstock to said carbon monoxide combustion burner wherein said Si-glass precursor feedstock and said dopant R-glass precursor feedstock is reacted in said flame into a dry R doped silica glass soot directed at said glass deposition surface, and said soot is concurrently directly deposited and vitrified into a dry homogeneous R doped silica glass body, and forming said directly deposited vitrified glass body into a homogeneous glass optical lithography element. Preferably dopant R-glass precursor feedstock is chosen from the R dopant group consisting of F, Ti, Ge, B, P, and Al. Supplying a Si-glass precursor feedstock preferably includes supplying a chlorine-free Si-glass precursor feedstock wherein said directly deposited vitrified glass is a chlorine-free (Cl<1 ppm) glass and said glass body is formed into a chlorine-free homogenous glass optical element. Supplying a Si-glass precursor feedstock preferably includes supplying a hydrogen-free Si-glass precursor feedstock wherein said directly deposited vitrified silicon oxyfluoride glass is a dry glass with an OH weight concentration<10 ppm OH and said glass body is formed into a dry homogenous glass optical element with an OH weight concentration<10 ppm OH. Most preferably supplying a Si-glass precursor feedstock includes supplying a chlorine-free hydrogen-free Si-glass precursor feedstock wherein said directly deposited vitrified glass is a dry chlorine-free silicon oxyfluoride glass with an OH weight concentration<10 ppm OH and said glass body is formed into a dry chlorine-free homogeneous glass element with an OH weight concentration<10 ppm OH, more preferably wherein said chlorine-free hydrogen-free Si-glass precursor feedstock is silicon tetraisocyanate.

The invention includes a method of making a homogeneous glass optical lithography element, with method comprising providing a hydrogen-free fuel carbon monoxide combustion burner; providing a supply of carbon monoxide and a supply of oxygen to said carbon monoxide combustion burner to form a carbon monoxide combustion reaction flame, providing a direct glass deposition surface proximate said flame, supplying a Si-glass precursor feedstock to said carbon monoxide combustion burner wherein said Si-glass precursor feedstock is reacted in said flame into a dry silica glass soot directed at said glass deposition surface, and said soot is concurrently directly deposited and vitrified into a dry homogeneous silica glass body, and forming said directly deposited vitrified glass body into a homogeneous glass optical lithography element. Preferably supplying a Si-glass precursor feedstock includes supplying a chlorine-free Si-glass precursor feedstock wherein said directly deposited vitrified glass is a chlorine-free (Cl<1 ppm) glass and said glass body is formed into a chlorine-free homogenous glass optical element. Preferably supplying a Si-glass precursor feedstock includes supplying a hydrogen-free Si-glass precursor feedstock wherein said directly deposited vitrified glass is a dry glass with an OH weight concentration<10 ppm OH and said glass body is formed into a dry homogenous glass optical element with an OH weight concentration<10 ppm OH, preferably OH weight concentration<1 ppm. In a preferred embodiment supplying a Si-glass precursor feedstock includes supplying a chlorine-free hydrogen-free Si-glass precursor feedstock wherein said directly deposited vitrified silicon glass is a dry chlorine-free silicon-glass with an OH weight concentration<10 ppm OH and said glass body is formed into a dry chlorine-free homogeneous glass element with an OH weight concentration<10 ppm OH, preferably OH weight concentration<1 ppm.

Since fluorine is a desirable component of the inventive fused silica, fluorine-containing F-glass precursor feedstocks starting material such as silicon fluoride, silicon tetrafluoride and mixtures of these, may be used in the methods of the invention. In addition to utilizing silicon fluoride starting materials, fluorine source starting material F-glass precursor feedstocks such as $CF_4$, $SF_6$, $F_2$, $C_3F_8$ and $C_2F_6$ can be used along with silicon-containing starting material compound Si-glass precursor feedstocks reacting to produce fluorine doped silica from silicon fluoride silica soots.

In addition to being preferably free of OH groups, being fluorine-doped and essentially free of chlorine, we have found that the inventive fused silica photomask blank is also preferably low in molecular hydrogen, preferably less than $1 \times 10^{17}$ molecules/cm$^3$, and more preferably less than $5 \times 10^{16}$ molecules/cm$^3$ of molecular hydrogen.

Reducing the OH content to less than 50 ppm, preferably less than 10 ppm, and most preferably less than 1 ppm and doping the silica glass with fluorine provides for increased transmission at 157 nm and in lowered thermal expansion. The preferred 157 nm transmission photolithography fluorine doped low OH fused SiO$_2$ glass photomask substrate has a transmittance of at least 80%, preferably at least about 83%/cm at 157 nm, and a thermal expansion less than 0.55 ppm/° C., preferably less than 0.53 ppm/° C.

The invention further includes a below 175 nm VUV lithography glass. The lithography glass comprises a fused silicon oxyfluoride glass. The silicon oxyfluoride glass has an OH content less than 5 ppm by weight, a Cl content less than 5 ppm by weight, a H$_2$ content less than $1 \times 10^{17}$ molecules/cm$^3$, and a fluorine content of at least 0.1% weight %, with said glass having a 157 nm internal transmission of at least 80%/cm and preferably at least 85%/cm. The silicon oxyfluoride glass has a below fused silica coefficient of thermal expansion that is less than 0.55 ppm/° C. in the room temperature to 300° C. range. Preferably the lithography glass has an internal transmission in the wavelength range of 157 nm to 175 nm of at least 80%/cm, and more preferably at least 85%/cm. Preferably the silicon oxyfluoride lithography glass has an increase of absorption at 215 nm of less than 0.1 optical density (log$_{10}$ transmission) per mm when exposed to at least $0.96 \times 10^6$ pulses of 157 nm wavelength containing F$_2$ excimer laser radiation at 4 m J/cm$^2$-pulse, and more preferably the increase of absorption at 215 nm is less than 0.05 optical density, and most preferably substantially no 215 nm absorption band is formed. Preferably the Cl content of the glass is less than 1 ppm and the OH content is less than 1 ppm, and more preferably the glass consists essentially of Si, O, and F. Preferably the glass is essentially free of metal to metal Si—Si bonds, and the glass is free of a 165 nm absorbing center with an internal transmission at 165 run of at least 85%/cm.

In a preferred embodiment the lithography glass is used to make a VUV transmitting photomask where VUV light is transmitted through the photomask, preferably with a surface of the lithography glass having a patterned deposited film (such as Cr) that forms a transmitting photolithography mask pattern. In a further embodiment the lithography glass is used to make a VUV phase shifting photomask where the phase of VUV lithography light traveling through the glass is shifted and manipulated to form constructive and/or destructive interference patterns. In a further embodiment the lithography glass with a lowered thermal expansion and a thermal expansion coefficient less than 0.55 ppm/° C. is used to make a reflective photomask wherein a reflective patterned lithography mask pattern is supported by said silicon oxyfluoride glass.

The invention further includes a pattern printing method of VUV lithography which includes providing a below 164 nm radiation source for producing VUV lithography photons, providing a silicon oxyfluoride lithography glass having less than 5 ppm by weight OH, less than 5 ppm by weight Cl, and 157 nm and 165 nm measured transmission of at least 75%/5 mm, transmitting the VUV lithography photons through the provided silicon oxyfluoride lithography glass, forming a lithography pattern with the photons, and reducing the formed lithography pattern and projecting the formed pattern onto a VUV radiation sensitive lithography printing medium to form a printed lithography pattern.

Providing the oxyfluoride lithography glass preferably includes lowering the VUV cutoff wavelength of the glass by providing an Si-glass forming precursor, and lowering the H$_2$, the OH, and the Cl content of the direct deposit vitrified glass made therefrom and increasing the F content of the direct deposit vitrified glass to provide a direct deposit vitrified silicon oxyfluoride glass with a 50% transmission VUV cutoff wavelength below 160 nm. Preferably the provided glass consists essentially of Si, O, and F and is essentially free of Si—Si bonds.

The invention provides a 157 nm photolithography photomask substrate photomask stage and a 157 nm photolithography device (157 nm illumination system, photomaskmask stage, 157 nm projection optics system, 157 nm wafer stage) with such a fluorine doped low OH silicon oxyfluoride photomask silica glass substrate that has an OH content less than 1 ppm, a fluorine content in the range from 0.1 to 1.5 wt. %, 157 nm internal transmittances of at least 50%, and preferably at least 65%, and most preferably at least 83%/cm at 157 nm, and preferably a thermal expansion less than 0.55 ppm, preferably less than 0.53 ppm, and most preferably less than or equal to 0.52 ppm/° C.

Polished substrates, 25 mm×25 mm×1.5 mm thick, were prepared from the silicon oxyfluoride glass. For comparison, 25 mm×25 mm×6.35 mm thick, substrates were also cut from a standard commercial silica photomask substrate. The substrates were cleaned in a sulfuric acid/peroxide solution and mask detergent, then spin-dried and baked at 120° C. Cr films, 100 nm thick, were deposited by sputtering. Film adhesion measurements were made by indentation and scratch testing using a Nanoindenter II. Under the same test conditions, delamination of the Cr film could not be induced on either type of substrate. These results indicate good film adhesion.

The silica glass structure can be described as a network of SiO$_4$ tetrahedra bonded together at all four corners and randomly oriented with respect to one another. Water is incorporated into the structure as ≡Si—OH (where ≡ indicates bonding to the SiO$_4$ network) such that the bond to the neighboring tetrahedron is broken at the OH group. OH produces absorption in the deep UV at <175-nm. Fluorine is similarly incorporated into the structure as ≡Si—F with the connectivity of the network being broken at the F atom. Electronic transitions associated with the Si—F bond are expected to be at higher energies (shorter wavelengths) than those from the Si—O network bonds.

The fluorine-doped silica structure is particularly resistant to damage by F$_2$ excimer laser irradiation. Here, we have shown that formation of E' color centers is highly suppressed in the fluorinated structure, even in silica containing a very low concentration of fluorine. It is possible that the fluorine reduces the number of precursor sites for color center formation such as weak or strained bonds and oxygen-deficient Si—Si defects.

In a preferred embodiment the invention includes a below 193 nm VUV transmitting glass photomask substrate for photolithography at wavelengths of about 157 nm. The VUV transmitting glass substrate comprises high purity oxyfluoride glass with an OH content below 50 ppm by weight, hydrogen content below $1 \times 10^{17}$ molecules cm$^3$, and a fluorine content in the range of 0.1 to 0.4 weight percent. Preferably the glass has a Cl content below 5 ppm, more preferably below 1 ppm, and most preferably with the glass being essentially free of chlorine. Preferably the glass has a molecular hydrogen content below $3 \times 10^{16}$ molecules/cm$^3$, and more preferably has no detectable molecular hydrogen content. Preferably the glass has an OH content below 10 ppm by weight, more preferably below 1 ppm by weight, and most preferably has no detectable OH content and is essentially OH free. Preferably the glass is comprised of Si, O, and F and is essentially free of OH, Cl and $H_2$. Preferably the silicon oxyfluoride glass photomask substrate has an internal transmittance at 157 nm of at least 89%/cm, most preferably with the substrate having a measured transmittance of at least 79% through a thickness of the photomask substrate with the substrate being about 6 mm thick, such as 6.35 mm thick.

In a preferred embodiment the invention includes a process of making a VUV transmitting glass having high resistance to optical damage to excimer laser radiation in the 157 nm wavelength region. The process includes forming a dry, non-porous monolithic body of transparent fused silicon oxyfluoride glass with a fluorine content less than 0.5 weight percent.

The invention includes a $F_2$ laser-induced absorption resistant silicon oxyfluoride glass suitable for use in the 157 nm wavelength region, the glass having a stable and high transmission at 157.6 nm with a fluorine content less than 0.5 weight % such that the glass has a transmission loss at 157.6 nm<1% after exposure to a $F_2$ excimer laser for 60 million pulses at 0.1 mJ/$cm^2$-pulse. The silicon oxyfluoride glass preferably is essentially free of OH groups, has less than $5\times10^{16}$ molecules/$cm^3$ of molecular hydrogen, and a fluorine content in the range of about 0.1 to 0.4 weight %.

The invention includes a $F_2$ laser-induced absorption resistant lithography glass comprising a silicon oxyfluoride glass having an OH content less than 5 ppm, by weight, a Cl content less than 5 ppm by weight, and a fluorine content of 0.1 to 0.4 weight % with a 157 nm internal transmission of at least 80%/cm, more preferably 85%/cm. Preferably the glass has a H2 content less than $1\times10^{17}$ molecules/$cm^3$. The silicon oxyfluoride glass is resistant to laser-induced absorption and has a 157 nm transmission loss<1% after exposure to a 157 nm laser for 60 million pulses at 0.1 mJ/$cm^2$-pulse. The silicon oxyfluoride glass has a resistance to 157.6 nm induced absorption, with the fluorine content inhibiting 165 nm absorption oxygen-deficient centers. Preferably the glass has a 165 nm absorption less than 0.4 (absorption units/5 mm) after exposure to a 157 nm laser for 41.5 million pulses at 2 mJ/$cm^2$-pulse of 157 nm laser, and most preferably the 165 nm absorption is less than 0.2 (absorption units/5 mm). Preferably the Cl content is less than 1 ppm and the OH content is less than 1 ppm, preferably with the glass consisting essentially of Si, O and F. In an embodiment the glass is a VUV transmitting photomask. In an embodiment the glass is a VUV phase shifting photomask. Preferably the glass photomasks have a resistance to laser induced oxygen-deficient centers, preferably with the glass essentially free of metal to metal Si—Si bonds and free of a 165 nm absorbing center and has an internal transmission at 165 nm of at least 85%/cm.

The invention includes a VUV pattern printing method. The pattern printing method includes providing a below 164 nm radiation source for producing VUV photons, providing a silicon oxyfluoride glass having less than 5 ppm by weight OH, less than 5 ppm by weight Cl, a less than 0.5 weight percent fluorine content, and a 157 nm and 165 nm measured transmission of at least 75%/5 mm. The method includes transmitting the VUV photons through the silicon oxyfluoride glass, forming a pattern with the VUV photons, and projecting the pattern onto a VUV radiation sensitive printing medium to form a printed pattern. In a preferred embodiment the VUV lithography pattern printing method which includes providing a VUV lithography photon radiation source, providing a silicon oxyfluoride lithography glass with less than 1 ppm OH, transmitting the VUV lithography photons through the silicon oxyfluoride lithography glass, forming a lithography pattern with the VUV photons, and projecting the lithography pattern onto a VUV radiation sensitive lithography printing medium to form a printed lithography pattern.

The VUV pattern printing method preferably includes lowering the VUV cut off wavelength of the silicon oxyfluoride glass by providing an Si-glass forming precursor and doping with an F content to provide a silicon oxyfluoride glass with a 50% transmission VUV cut off wavelength below 160 nm and a 165 nm absorption less than 0.4 (absorption units/5 mm) after exposure to a 157 nm laser for 4.5 million pulses at 2 mJ/$cm^2$-pulse.

The invention provides superior transmission in the VUV with the silicon oxyfluoride glasses having high purity and being dry (<1 ppm OH). The inventive glasses have provided 157 nm transmissions such as 79.8%/6.35 mm (and 90%/cm internal T). The silicon oxyfluoride glass is preferably utilized as components for 157 nm lithography, particularly photomask substrates, pellicles, thin lenses and windows. For these lithography applications, it is not only important that the glass exhibits a high initial transmission, but the transmission must not decrease under exposure to the $F_2$ excimer laser. The glass provides a<1% transmission loss at 157.6 nm after exposure to the $F_2$ excimer laser for 60 million pulses at 0.1 mJ/$cm^2$-pulse. Our preferred silicon oxyfluoride glass compositions exhibit improved resistance to $F_2$ laser-induced absorption.

We have discovered that although the addition of fluorine to a dry silica glass improves its transmission in the vacuum ultraviolet, particularly near the UV edge (e.g., at 157 nm), high concentrations of fluorine in the glass are detrimental to its laser damage resistance. Specifically, we have found that under $F_2$ excimer laser exposure, the induced absorption in the glass is proportional to the fluorine content of the glass. As the fluorine content increases, the 157.6 nm induced absorption increases.

Preferably our silicon oxyfluoride glass has a fluoride content less than 0.5 wt. % F. Our <0.5 wt. % F dry silicon oxyfluoride glass exhibits good laser durability and suitability for applications involving exposure to $F_2$ excimer laser radiation. Our preferred composition range for attaining both high initial transmission and low induced absorption is 0.1–0.4 wt. % F.

The invention includes a VUV transmitting silicon oxyfluoride glass having an OH content less than 5 ppm by weight, a fluorine content of at least 0.1 weight %. Preferably the glass consists essentially of Si, O and F with the glass having an internal transmission in the wavelength range of 157 nm to 175 nm of at least 85%/cm. Preferably the glass has a 165 nm absorption less than 0.4 (absorption units/5 mm) after exposure to a 157 nm laser for 41.5 million pulses at 2 mJ/$cm^2$-pulse.

EXAMPLES

In order to achieve the desired transmission at 157 nm (85%/6.35 mm (measured), the concentrations of OH, Cl, metals (e.g. Fe, Zr), intrinsic defects (e.g. peroxy linkage), and macroscopic defects (e.g. gas bubbles) must be minimized. The direct-to-glass, dry combustion process using CO fuel, is a preferred way to make dry, F-doped $SiO_2$ glass for this and other applications. The dry, doped $SiO_2$ glass is produced directly in a single step process. Due to the presence of H, a methane burner is effectively limited to production of relatively wet soot which then requires the additional processing steps of drying and consolidation to produce dry glass as a multi-step based process. Note, however, that although a CO burner makes it possible to produce dry glass directly, it is preferably used in conjunction with: (i) a H-free Si source (e.g. $SiCl_4$) and, (ii) exclusion of outside sources of H (e.g. air leaks). Besides enabling the production of dry, doped $SiO_2$ glass, the invention provides benefits of (i) increased glass purity (CO reacts with most metals to form carbonyls), and (ii) decreased $CF_4$ consumption/abatement (compared to F-doping $SiO_2$ soot in consolidation, the dry combustion process requires much less $CF_4$ to achieve the same F levels).

Although developed for production of 157 nm photomask plates, the invention provides the use of dry combustion to produce dry, doped glasses for use as optical elements. The glass is preferably produced directly in a single step. The dopant may be F, or one or more metal oxides (including $TiO_2$, $GeO_2$, $B_2O_3$, $P_2O_5$) required to produce the desired property.

The invention focused on the production of dry, F-doped $SiO_2$ glass with a measured transmission of ≧85%/6.35 mm at 157 nm for use as photomask plates for photolithography. In order to achieve the desired transmission, the concentrations of the following must be minimized: (i) impurities (notably water (OH), Cl, and metals (e.g. Fe, Zr)), (ii) intrinsic defects (notably oxygen deficient centers and peroxy linkages), and (iii) macroscopic defects (notably gas bubbles).

Both experimental and theoretical work was undertaken to determine how process conditions affect the concentrations of impurities and defects. The main focus was on thermodynamic predictions and experimental results for OH, Cl, tramp metals, and intrinsic defects. Table 1 summarizes the experimental results of the most pertinent dry CO combustion runs $CH_4$ with CO, and OMCTS with $SiCl_4$, in a single-burner furnace (FIG. 12).

Once the nitrogen curtain was deployed to help exclude moist air from the furnace chamber, dry glass (<1 ppm OH) was produced, with and without F-doping, but always using CO as the fuel and $SiCl_4$ as the Si source. Although it significantly reduced the Cl-content of the glass, when OMCTS, a Cl-free Si source, was substituted for $SiCl_4$ in run DC6, it resulted in glass that was too wet (~420 ppm OH) and which does not transmit in the VUV (FIG. 15 (1+14) shows the absorption edge due to water).

Chlorine

Like water, Cl decreases transmission in the VUV, with a strong correlation between absorption at the UV edge and residual chlorine in silica glass, and since Cl has a relatively high absorption cross-section at 157 nm ($6.32 \times 10^{-20}$ $cm^2$—about 40% of that for OH), only a very small amount of Cl can be tolerated in the glass for this application. Unfortunately, but not surprisingly, the use of $SiCl_4$, a H-free but Cl-containing Si source, leads to high levels of Cl in glass produced by the dry CO combustion process. The dry combustion process produced glass containing ~0.08 wt % Cl (DC3) from $SiCl_4$. Minimization of Cl in the glass therefore became the main focus in the development of the dry combustion process.

The following approaches for minimization of Cl in the glass were evaluated: (i) use Cl-free Si source (eliminate Cl in glass by eliminating Cl from the system), (ii) increase $O_2$ (minimize Cl in glass by increasing $O_2$ in combustion atmosphere), (iii) increase $CF_4$ (minimize Cl in glass by increasing F incorporation).

Theory and/or experiment indicate that all four of these approaches will lead to glass with lower Cl content; however, only (ii) and (iii) could be implemented without introducing H into the system. A Cl content of ~0.02 wt % (this is a 75% decrease from the "initial condition," DC3)

TABLE 1

157 nm transmission, OH, Cl, F, Fe and Zr analyses (by microprobe and ICP-MS) and the weight of glass produced in each run

| | DC3 | DC4 | DC5 | DC6 | DC7 | DC8 | DC10 |
|---|---|---|---|---|---|---|---|
| transmission @ 157 nm | ~20% thru 3 mm | ~20% thru 3 mm | ~23 thru 3 mm | ~2% thru 3 mm | ~21% thru 3 mm | ~29% thru 3 mm | ~25% thru 3 mm |
| OH-ppm | <1 ppm | <1 ppm | <1 ppm | <420 ppm | <1 ppm | <1 ppm | <1 ppm |
| Cl (avg. wt. %) | 0.08% | 0.03% | 0.02% | 0.00% | 0.04% | 10.04% | 0.06% |
| F (avg. wt. %) | 0.81% | 0.80% | 0.91% | 0.13% | none | 0.28% | 0.22% |
| Fe (avg. wt.%) | 0.0000066% [mp] | 0.000004% [mp] | 0.0023% [mp] 0.000004% [icp] | 0.000004% [icp] | 0.000005% [icp] | 0.000007% [icp] | 0.000004% [icp] |
| Zr (avg. wt. %) | 0.0000458% [mp] | 0.000045% [mp] | 0.0052% [mp] 0.00125% [icp] | 0.000006% [icp] | 0.00002% [icp] | 0.00003% [icp] | 0.000001% [icp] |
| Si source | $SiCl_4$ | $SiCl_4$ | $SiCl_4$ | omcts | $SiCl_4$ | $SiCl_4$ | $SiCl_4$ |
| glass weight | ~570 g | ~250 g | ~250 g | ~300 g | ~250 g | ~200 g | ~200 g |
| Si yield | 24.7% | 13.0% | 13.5% | 34.5% | 12.5% | 10.6% | 10% |
| experimental changes vs. previous run | | increase $O_2$ | decrease $SiCl_4$ increase $CF_4$ | OMCTS Si source | $SiCl_4$ Si source no $CF_4$ | decrease $CF_4$ vs. DC6 | purified CO $Al_2O_3$ brick |

Water

Water (as OH in the glass) decreases transmission in the VUV. For instance, HPFS™ (Corning code 7980), fused silica produced by the flame hydrolysis process (where $CH_4$ is the fuel and OMCTS is the Si source), does not transmit light at wavelengths below ~170 nm because of its high water content (~800 ppm OH typical), as shown in FIG. 15 (1+14). Minimization of water in the glass was the main driver for development of the dry combustion process, where H was eliminated from the burner inputs by replacing was achieved (DC5) using a combination of increased $O_2$ and increased $CF_4$. $Si(NCO)_4$ provides a beneficial feedstock.

The basic idea behind (i) is to entirely exclude Cl from the system, and is clearly the best way to minimize/eliminate Cl in the glass. The basic idea behind (ii) is that increasing $O_2$ in the combustion atmosphere will hinder the Cl-incorporation reaction, i.e. shift the following equilibrium to the left:

FIG. 16 (14+2) shows the predicted effect of increased $O_2$. The basic idea behind (iii) is that F and Cl occupy the same sites in $SiO_2$ and so increasing F concentration should decrease Cl concentration in the glass. Both theoretical and experimental evidence suggest that the approach is useful. Combined with increased $O_2$ and decreased $SiCl_4$ flow, increased F led to the lowest Cl glass produced by dry combustion with $SiCl_4$ as the Si source (DC5, ~0.02 wt % Cl).

Tramp Metals

Since tramp metals are known to reduce transmission in the UV, the objective was to produce high-purity glass with a minimum of tramp metals. However, given the relatively high Cl concentrations in these glasses, the transmission loss due to the presence of tramp metals is a second order effect. As shown in Table 1, the concentrations of Fe and Zr (the main tramp metals) were significantly decreased by the use of purified CO and by substituting $Al_2O_3$ for zircon refractories in DC10 (Fe was reduced by a factor of ~2, and Zr was reduced by a factor of ~10).

The absorption effect of contaminant species were studied in the silicon oxyflouride glass with the results as below.

TABLE 2

Absorption cross-sections at 157 nm and 193 nm

| Species | $\sigma \times 10^{-20}$ cm$^2$ (157 nm) | $\sigma \times 10^{-20}$ cm$^2$ (193 nm) | For 1%/cm T loss at 157 nm (ppm wt.) | For 1%/cm T loss at 193 nm (ppm wt.) |
|---|---|---|---|---|
| *Cl | 6.3 | | 2 (Cl) | |
| *OH | 16.8 | | 0.4 (OH) | |
| Al | 33.6 | | 0.56 ($Al_2O_3$) | |
| Na | 57.9 | 1.6 | 0.2 ($Na_2O$) | 7 ($Na_2O$) |
| Zr | 748 | 6.4 | 0.06 ($ZrO_2$) | 7 ($ZrO_2$) |
| Fe | 897 | 658 | 0.03 (FeO) | 0.04 (FeO) |

This Absorption cross-sections at 157 nm and 193 nm study showed the benefit of utilizing alumina refractory in the making of the 157 nm glass.

Intrinsic Defects

Both oxidized and reduced defects are known to decrease transmission at 157 nm, so the objective is to produce neutral (i.e. neither oxidized nor reduced) glass with a minimum of both types of defects. It is thought that the Si metal—metal bond defect is responsible for an absorption band at 165 nm—an absorption which significantly diminishes transmission at 157 nm. Intrinsic defects naturally occur in silicate glasses prepared at high temperatures under equilibrium conditions, and both temperature and stoichiometry are known to influence the concentrations. Experimentally we have shown that the 165 nm absorption band can be minimized/eliminated by decreasing the concentration of F in the glass. As shown in FIG. 1, the 165 nm absorption band appeared in all cases except DC7 (no F), DC8 (low F—0.28 wt %), and DC10 (low F—0.22 wt %).

It will be apparent to those skilled in the art that various modifications and variations can be made to the present invention without departing from the spirit and scope of the invention. Thus, it is intended that the present invention cover the modifications and variations of this invention provided they come within the scope of the appended claims and their equivalents.

What is claimed is:

1. A below 193 nm VUV transmitting glass photomask substrate for photolithography at wavelengths of about 157 nm, said glass photomask substrate comprising a dry high purity direct deposit vitrified silicon oxyfluoride glass with an OH content below 20 ppm by weight, a Cl content below 0.1% by weight, and a fluorine content in the range of 0.01 to 7 weight percent.

2. A glass photomask substrate as claimed in claim 1, wherein said dry high purity direct deposit vitrified silicon oxyfluoride glass has a fluorine content in the range of 0.01 to 2 weight percent.

3. A glass photomask substrate as claimed in claim 1, wherein said dry high purity direct deposit vitrified silicon oxyfluoride glass has a fluorine content in the range of 0.01 to 0.5 weight percent.

4. A glass photomask substrate as claimed in claim 1, wherein said dry high purity direct deposit vitrified silicon oxyfluoride glass has a fluorine content in the range 0.1 to 0.4 weight percent.

5. A glass photomask substrate as claimed in claim 1, wherein said dry high purity direct deposit vitrified silicon oxyfluoride glass has a Cl content $\leq 0.08\%$ by weight.

6. A glass photomask substrate as claimed in claim 1, wherein said dry high purity direct deposit vitrified silicon oxyfluoride glass has a Cl content $\leq 0.06\%$ by weight.

7. A glass photomask substrate as claimed in claim 1, wherein said dry high purity direct deposit vitrified silicon oxyfluoride glass has a Cl content $\leq 0.04\%$ by weight.

8. A glass photomask substrate as claimed in claim 1, wherein said dry high purity direct deposit vitrified silicon oxyfluoride glass has a Cl content $\leq 0.03\%$ by weight.

9. A glass photomask substrate as claimed in claim 1, wherein said dry high purity direct deposit vitrified silicon oxyfluoride glass has a Cl content $\leq 0.02\%$ by weight.

10. A glass photomask substrate as claimed in claim 1, wherein said dry high purity direct deposit vitrified silicon oxyfluoride glass has a Cl content below 5 ppm.

11. A glass photomask substrate as claimed in claim 1, wherein said dry high purity direct deposit vitrified silicon oxyfluoride glass has a Cl content below 1 ppm.

12. A glass photomask substrate as claimed in claim 1, wherein said dry high purity direct deposit vitrified silicon oxyfluoride glass is Cl-free.

13. A glass photomask substrate as claimed in claim 1, wherein said dry high purity direct deposit vitrified silicon oxyfluoride glass has an OH content below 10 ppm by weight.

14. A glass photomask substrate as claimed in claim 1, wherein said dry high purity direct deposit vitrified silicon oxyfluoride glass has an OH content below 1 ppm by weight.

15. A glass photomask substrate as claimed in claim 1, wherein said dry high purity direct deposit vitrified silicon oxyfluoride glass has a hydrogen content below $1 \times 10^{17}$ molecules/cm$^3$.

16. A glass photomask substrate as claimed in claim 1, wherein said dry high purity direct deposit vitrified silicon oxyfluoride glass has a Fe content no greater than 0.00004% by weight.

17. A glass photomask substrate as claimed in claim 1, wherein said dry high purity direct deposit vitrified silicon oxyfluoride glass has a Zr content no greater than 0.00004% by weight.

18. A glass photomask substrate as claimed in claim 1, wherein said dry high purity direct deposit vitrified silicon oxyfluoride glass contains a plurality of $O_2$ molecules.

19. A glass photomask substrate as claimed in claim 1, wherein said dry high purity direct deposit vitrified silicon oxyfluoride glass contains a plurality of $O_2$ molecules with an $O_2$ concentration of at least $10^{15}$ $O_2$ mole/cc.

* * * * *